United States Patent
Lee et al.

(10) Patent No.: US 10,364,493 B2
(45) Date of Patent: Jul. 30, 2019

(54) EXHAUST APPARATUS AND SUBSTRATE PROCESSING APPARATUS HAVING AN EXHAUST LINE WITH A FIRST RING HAVING AT LEAST ONE HOLE ON A LATERAL SIDE THEREOF PLACED IN THE EXHAUST LINE

(71) Applicant: ASM IP Holding B.V., Almere (NL)

(72) Inventors: Hak Joo Lee, Incheon (KR); Dae Youn Kim, Daejeon (KR); Seung Wook Kim, Gyeongsangnam-do (KR); Jin Seok Park, Gyeonggi-do (KR); Jae Hyun Kim, Gyeongsangbuk-do (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/672,063

(22) Filed: Aug. 8, 2017

(65) Prior Publication Data

US 2018/0057937 A1    Mar. 1, 2018

(30) Foreign Application Priority Data

Aug. 25, 2016 (KR) .......................... 10-2016-0108380

(51) Int. Cl.
*C23C 16/44* (2006.01)
*C23C 16/455* (2006.01)
(Continued)

(52) U.S. Cl.
CPC ........ *C23C 16/4412* (2013.01); *C23C 16/345* (2013.01); *C23C 16/455* (2013.01);
(Continued)

(58) Field of Classification Search
CPC ......... C30B 25/00; C30B 25/02; C30B 25/14; C30B 25/16; C30B 25/165; C23C 16/345;
(Continued)

(56) References Cited

U.S. PATENT DOCUMENTS

| D30,036 S | 1/1899 | Rhind |
| D31,889 S | 11/1899 | Gill |

(Continued)

FOREIGN PATENT DOCUMENTS

| CN | 2588350 | 11/2003 |
| CN | 1664987 | 9/2005 |

(Continued)

OTHER PUBLICATIONS

USPTO; Notice of Allowance dated Jun. 28, 2017 in U.S. Appl. No. 13/166,367.

(Continued)

*Primary Examiner* — Kenneth A Bratland, Jr.
(74) *Attorney, Agent, or Firm* — Snell & Wilmer L.L.P.

(57) ABSTRACT

An exhaust apparatus using a gas curtain instead of a mechanical opening/closing structure is provided. The exhaust apparatus includes: a first region; a second region connected to the first region; a third region connected to the first region; and a first gas line connected to the second region, wherein when gas is supplied to the first gas line, the first region does not communicate with the second region but communicates with the third region.

25 Claims, 15 Drawing Sheets

(51) Int. Cl.
*C23C 16/34* (2006.01)
*H01J 37/32* (2006.01)

(52) U.S. Cl.
CPC .... *C23C 16/4554* (2013.01); *C23C 16/45544* (2013.01); *C23C 16/45561* (2013.01); *H01J 37/32449* (2013.01); *H01J 37/32513* (2013.01); *H01J 37/32834* (2013.01)

(58) Field of Classification Search
CPC ... C23C 16/44; C23C 16/4412; C23C 16/448; C23C 16/455; C23C 16/4554; C23C 16/45562; H01J 37/32449; H01J 37/32513; H01J 37/32834
USPC .... 117/84, 88, 102, 200–202; 118/715, 722, 118/733
See application file for complete search history.

(56) References Cited

U.S. PATENT DOCUMENTS

| | | | |
|---|---|---|---|
| 2,059,480 | A | 11/1936 | Obermaier |
| 2,161,626 | A | 6/1939 | Loughner et al. |
| 2,266,416 | A | 12/1941 | Duclos Aeneas Jn |
| 2,280,778 | A | 4/1942 | Anderson |
| 2,410,420 | A | 11/1946 | Bennett |
| 2,563,931 | A | 8/1951 | Harrison |
| 2,660,061 | A | 11/1953 | Lewis |
| 2,745,640 | A | 5/1956 | Cushman |
| 2,990,045 | A | 9/1959 | Root |
| 3,038,951 | A | 6/1962 | Mead |
| 3,089,507 | A | 5/1963 | Drake et al. |
| 3,094,396 | A | 6/1963 | Flugge et al. |
| 3,232,437 | A | 2/1966 | Hultgren |
| 3,263,502 | A | 8/1966 | Springfield |
| 3,410,349 | A | 11/1968 | Troutman |
| 3,588,192 | A | 6/1971 | Drutchas et al. |
| 3,647,387 | A | 3/1972 | Benson |
| 3,647,716 | A | 3/1972 | Koches |
| 3,713,899 | A | 1/1973 | Sebestyen |
| 3,718,429 | A | 2/1973 | Williamson |
| 3,833,492 | A | 9/1974 | Bollyky |
| 3,854,443 | A | 12/1974 | Baerg |
| 3,862,397 | A | 1/1975 | Anderson et al. |
| 3,867,205 | A | 2/1975 | Schley |
| 3,885,504 | A | 5/1975 | Baermann |
| 3,887,790 | A | 6/1975 | Ferguson |
| 3,904,371 | A | 9/1975 | Neti |
| 3,913,058 | A | 10/1975 | Nishio et al. |
| 3,913,617 | A | 10/1975 | van Laar |
| 3,947,685 | A | 3/1976 | Meinel |
| 3,960,559 | A | 6/1976 | Suzuki |
| 4,054,071 | A | 10/1977 | Patejak |
| 4,058,430 | A | 11/1977 | Suntola et al. |
| 4,093,491 | A | 6/1978 | Whelpton et al. |
| D249,341 | S | 9/1978 | Mertz |
| 4,126,027 | A | 11/1978 | Smith et al. |
| 4,134,425 | A | 1/1979 | Gussefeld et al. |
| 4,145,699 | A | 3/1979 | Hu et al. |
| 4,164,959 | A | 8/1979 | Wurzburger |
| 4,176,630 | A | 12/1979 | Elmer |
| 4,181,330 | A | 1/1980 | Kojima |
| 4,194,536 | A | 3/1980 | Stine et al. |
| 4,217,463 | A | 8/1980 | Swearingen |
| 4,234,449 | A | 11/1980 | Wolson et al. |
| 4,355,912 | A | 10/1982 | Haak |
| 4,444,990 | A | 4/1984 | Villar |
| 4,454,370 | A | 6/1984 | Voznick |
| 4,455,193 | A | 6/1984 | Jeuch et al. |
| 4,466,766 | A | 8/1984 | Geren et al. |
| 4,527,005 | A | 7/1985 | McKelvey et al. |
| 4,537,001 | A | 8/1985 | Uppstrom |
| 4,579,378 | A | 4/1986 | Snyders |
| 4,590,326 | A | 5/1986 | Woldy |
| 4,611,966 | A | 9/1986 | Johnson |
| 4,620,998 | A | 11/1986 | Lalvani |
| 4,721,533 | A | 1/1988 | Phillippi et al. |
| 4,749,416 | A | 6/1988 | Greenspan |
| 4,830,515 | A | 5/1989 | Cortes |
| 4,854,266 | A | 8/1989 | Simson et al. |
| 4,934,831 | A | 6/1990 | Volbrecht |
| 4,949,848 | A | 8/1990 | Kos |
| D311,126 | S | 10/1990 | Crowley |
| 4,989,992 | A | 2/1991 | Piai |
| 5,061,083 | A | 10/1991 | Grimm et al. |
| 5,071,258 | A | 12/1991 | Usher et al. |
| 5,108,192 | A | 4/1992 | Mailliet et al. |
| 5,154,301 | A | 10/1992 | Kos |
| 5,158,128 | A | 10/1992 | Inoue et al. |
| 5,176,451 | A | 1/1993 | Sasada |
| 5,181,779 | A | 1/1993 | Shia et al. |
| 5,228,114 | A | 7/1993 | Suzuki |
| 5,246,218 | A | 9/1993 | Yap et al. |
| 5,294,778 | A | 3/1994 | Carman et al. |
| 5,314,570 | A | 5/1994 | Ikegaya et al. |
| 5,356,672 | A | 10/1994 | Schmitt et al. |
| D353,452 | S | 12/1994 | Groenhoff |
| 5,374,315 | A | 12/1994 | Deboer et al. |
| 5,388,945 | A | 2/1995 | Garric et al. |
| 5,407,449 | A | 4/1995 | Zinger |
| 5,423,942 | A | 6/1995 | Robbins et al. |
| 5,523,616 | A | 6/1996 | Yasuhide |
| 5,527,111 | A | 6/1996 | Lysen et al. |
| 5,616,264 | A | 4/1997 | Nishi et al. |
| 5,663,899 | A | 9/1997 | Zvonar et al. |
| 5,697,706 | A | 12/1997 | Ciaravino et al. |
| 5,708,825 | A | 1/1998 | Sotomayor |
| 5,716,133 | A | 2/1998 | Hosokawa et al. |
| D392,855 | S | 3/1998 | Pillow |
| 5,753,835 | A | 5/1998 | Gustin |
| 5,761,328 | A | 6/1998 | Solberg et al. |
| 5,779,203 | A | 7/1998 | Edlinger |
| 5,791,782 | A | 8/1998 | Wooten et al. |
| 5,806,980 | A | 9/1998 | Berrian |
| 5,813,851 | A | 9/1998 | Nakao |
| 5,819,092 | A | 10/1998 | Ferguson et al. |
| 5,827,435 | A | 10/1998 | Seiji |
| 5,844,683 | A | 12/1998 | Pavloski et al. |
| 5,857,777 | A | 1/1999 | Schuh |
| 5,863,123 | A | 1/1999 | Lee |
| 5,884,640 | A | 3/1999 | Fishkin et al. |
| D412,270 | S | 7/1999 | Fredrickson |
| 5,947,718 | A | 9/1999 | Weaver |
| 5,954,375 | A | 9/1999 | Trickle et al. |
| 5,961,775 | A | 10/1999 | Fujimura |
| 5,970,621 | A | 10/1999 | Bazydola |
| 5,982,931 | A | 11/1999 | Ishimaru |
| 5,984,391 | A | 11/1999 | Vanderpot et al. |
| 5,987,480 | A | 11/1999 | Donohue et al. |
| 5,998,870 | A | 12/1999 | Lee et al. |
| 6,013,920 | A | 1/2000 | Gordon et al. |
| 6,045,260 | A | 4/2000 | Schwartz et al. |
| 6,054,678 | A | 4/2000 | Miyazaki |
| 6,060,721 | A | 5/2000 | Huang |
| 6,073,973 | A | 6/2000 | Boscaljon et al. |
| 6,091,062 | A | 7/2000 | Pfahnl et al. |
| 6,093,252 | A | 7/2000 | Wengert et al. |
| 6,102,565 | A | 8/2000 | Kita et al. |
| 6,104,011 | A | 8/2000 | Juliano |
| 6,104,401 | A | 8/2000 | Parsons |
| 6,119,710 | A | 9/2000 | Brown |
| 6,121,061 | A | 9/2000 | Van Bilsen et al. |
| 6,158,941 | A | 12/2000 | Muka et al. |
| 6,203,613 | B1 | 3/2001 | Gates et al. |
| 6,235,858 | B1 | 5/2001 | Swarup et al. |
| 6,243,654 | B1 | 6/2001 | Johnson et al. |
| 6,257,758 | B1 | 7/2001 | Culbertson |
| 6,293,700 | B1 | 9/2001 | Lund et al. |
| 6,311,016 | B1 | 10/2001 | Yanagawa et al. |
| 6,344,084 | B1 | 2/2002 | Koinuma et al. |
| D455,024 | S | 4/2002 | Mimick et al. |
| 6,432,849 | B1 | 8/2002 | Endo et al. |
| 6,435,865 | B1 | 8/2002 | Tseng et al. |
| 6,438,502 | B1 | 8/2002 | Awtrey |

(56) References Cited

U.S. PATENT DOCUMENTS

| | | |
|---|---|---|
| 6,441,350 B1 | 8/2002 | Stoddard et al. |
| 6,447,232 B1 | 9/2002 | Davis et al. |
| 6,494,998 B1 | 12/2002 | Brcka |
| 6,496,819 B1 | 12/2002 | Bello et al. |
| 6,503,079 B2 | 1/2003 | Kogano et al. |
| 6,507,410 B1 | 1/2003 | Robertson et al. |
| 6,536,950 B1 | 3/2003 | Green |
| 6,559,026 B1 | 5/2003 | Rossman et al. |
| 6,574,644 B2 | 6/2003 | Hsu et al. |
| 6,580,050 B1 | 6/2003 | Miller et al. |
| 6,607,948 B1 | 8/2003 | Sugiyama et al. |
| 6,660,662 B2 | 12/2003 | Ishikawa et al. |
| 6,676,290 B1 | 1/2004 | Lu |
| 6,682,971 B2 | 1/2004 | Tsuneda et al. |
| 6,684,659 B1 | 2/2004 | Tanaka et al. |
| 6,699,399 B1 | 3/2004 | Qian et al. |
| 6,722,837 B2 | 4/2004 | Inui |
| 6,755,221 B2 | 6/2004 | Jeong et al. |
| 6,756,085 B2 | 6/2004 | Waldfried |
| 6,828,235 B2 | 12/2004 | Takano |
| 6,846,146 B2 | 1/2005 | Inui |
| D505,590 S | 5/2005 | Greiner |
| 6,889,211 B1 | 5/2005 | Yoshiura et al. |
| 6,913,152 B2 | 7/2005 | Zuk |
| 6,981,832 B2 | 1/2006 | Zinger et al. |
| 6,982,046 B2 | 1/2006 | Srivastava et al. |
| 7,010,580 B1 | 3/2006 | Fu et al. |
| 7,017,514 B1 | 3/2006 | Shepherd et al. |
| 7,070,178 B2 | 7/2006 | Van Der Toorn et al. |
| 7,073,834 B2 | 7/2006 | Matsumoto et al. |
| 7,080,545 B2 | 7/2006 | Dimeo et al. |
| 7,090,394 B2 | 8/2006 | Hashikura et al. |
| 7,111,232 B1 | 9/2006 | Bascom |
| 7,156,380 B2 | 1/2007 | Soininen |
| 7,168,852 B2 | 1/2007 | Linnarsson |
| 7,223,014 B2 | 5/2007 | Lojen |
| 7,274,867 B2 | 9/2007 | Peukert |
| 7,296,460 B2 | 11/2007 | Dimeo et al. |
| 7,307,028 B2 | 12/2007 | Goto et al. |
| 7,320,544 B2 | 1/2008 | Hsieh |
| 7,351,057 B2 | 4/2008 | Berenbak et al. |
| 7,354,873 B2 | 4/2008 | Fukazawa et al. |
| 7,376,520 B2 | 5/2008 | Wong |
| 7,379,785 B2 | 5/2008 | Higashi et al. |
| 7,410,290 B2 | 8/2008 | Tanaka |
| D576,001 S | 9/2008 | Brunderman |
| 7,422,635 B2 | 9/2008 | Zheng et al. |
| 7,456,429 B2 | 11/2008 | Levy |
| 7,475,588 B2 | 1/2009 | Dimeo et al. |
| 7,497,614 B2 | 3/2009 | Gaff |
| 7,547,633 B2 | 6/2009 | Ravish et al. |
| 7,561,982 B2 | 7/2009 | Rund et al. |
| D600,223 S | 9/2009 | Aggarwal |
| 7,582,575 B2 | 9/2009 | Fukazawa et al. |
| 7,591,601 B2 | 9/2009 | Matsuoka et al. |
| 7,621,672 B2 | 11/2009 | Ripley |
| 7,622,369 B1 | 11/2009 | Lee et al. |
| 7,623,940 B2 | 11/2009 | Huskamp et al. |
| 7,651,269 B2 | 1/2010 | Comendant |
| 7,651,959 B2 | 1/2010 | Fukazawa et al. |
| 7,661,299 B2 | 2/2010 | Kusunoki |
| 7,692,171 B2 | 4/2010 | Kaszuba et al. |
| 7,716,993 B2 | 5/2010 | Ozawa et al. |
| 7,736,437 B2 | 6/2010 | Cadwell et al. |
| 7,749,563 B2 | 7/2010 | Zheng et al. |
| 7,753,584 B2 | 7/2010 | Gambino et al. |
| 7,781,352 B2 | 8/2010 | Fukazawa et al. |
| 7,789,559 B2 | 9/2010 | Waser et al. |
| 7,806,587 B2 | 10/2010 | Kobayashi |
| 7,807,566 B2 | 10/2010 | Tsuji et al. |
| 7,829,460 B2 | 11/2010 | Streck et al. |
| 7,858,519 B2 | 12/2010 | Liu et al. |
| 7,871,198 B2 | 1/2011 | Rempe et al. |
| 7,874,726 B2 | 1/2011 | Jacobs et al. |
| D634,329 S | 3/2011 | Wastrom |
| 7,915,667 B2 | 3/2011 | Knoefler et al. |
| 7,946,762 B2 | 5/2011 | Yednak |
| 7,955,650 B2 | 6/2011 | Tsuji |
| 7,957,708 B2 | 6/2011 | Karschnia et al. |
| 7,967,913 B2 | 6/2011 | Hua et al. |
| 7,997,795 B2 | 8/2011 | Schwagerman et al. |
| 8,046,193 B2 | 10/2011 | Yetter et al. |
| D651,291 S | 12/2011 | Liebson et al. |
| 8,076,251 B2 | 12/2011 | Akae et al. |
| 8,078,310 B2 | 12/2011 | Nishimoto et al. |
| 8,084,104 B2 | 12/2011 | Shinriki et al. |
| 8,100,583 B2 | 1/2012 | Aggarwal |
| 8,110,099 B2 | 2/2012 | Hersey et al. |
| 8,158,512 B2 | 4/2012 | Ji et al. |
| 8,172,947 B2 | 5/2012 | Shibata et al. |
| 8,178,436 B2 | 5/2012 | King et al. |
| 8,349,083 B2 | 1/2013 | Takasuka et al. |
| 8,398,773 B2 | 3/2013 | Jdira et al. |
| 8,415,258 B2 | 4/2013 | Akae |
| 8,496,377 B2 | 7/2013 | Harr et al. |
| 8,497,213 B2 | 7/2013 | Yasui et al. |
| 8,501,599 B2 | 8/2013 | Ueno et al. |
| 8,506,162 B2 | 8/2013 | Schick et al. |
| 8,529,701 B2 | 9/2013 | Morita |
| D695,240 S | 12/2013 | Iida et al. |
| 8,616,765 B2 | 12/2013 | Darabnia et al. |
| D698,904 S | 2/2014 | Milligan et al. |
| D702,188 S | 4/2014 | Jacobs |
| 8,710,580 B2 | 4/2014 | Sakuma et al. |
| D705,762 S | 5/2014 | Yu |
| 8,664,127 B2 | 5/2014 | Bhatia et al. |
| 8,722,510 B2 | 5/2014 | Watanabe et al. |
| 8,779,502 B2 | 7/2014 | Sakuma et al. |
| 8,790,749 B2 | 7/2014 | Omori et al. |
| 8,846,502 B2 | 9/2014 | Haukka et al. |
| 8,882,923 B2 | 11/2014 | Saido et al. |
| 8,901,016 B2 | 12/2014 | Jeongseok et al. |
| 8,945,305 B2 | 2/2015 | Marsh |
| 8,945,339 B2 | 2/2015 | Kakimoto |
| D723,330 S | 3/2015 | York |
| 8,974,868 B2 | 3/2015 | Ishikawa et al. |
| 8,993,457 B1 | 3/2015 | Ramkumar et al. |
| 9,018,567 B2 | 4/2015 | de Ridder et al. |
| 9,023,738 B2 | 5/2015 | Kato et al. |
| 9,029,244 B2 | 5/2015 | Won et al. |
| D733,843 S | 7/2015 | Yamagishi |
| 9,099,505 B2 | 8/2015 | Kusakabe et al. |
| 9,129,897 B2 | 9/2015 | Pore et al. |
| 9,136,180 B2 | 9/2015 | Machkaoutsan |
| 9,142,437 B2 | 9/2015 | Fosnight et al. |
| D742,202 S | 11/2015 | Cyphers et al. |
| D743,357 S | 11/2015 | Vyne |
| 9,190,264 B2 | 11/2015 | Yuasa et al. |
| 9,257,274 B2 | 2/2016 | Kang et al. |
| 9,267,850 B2 | 2/2016 | Aggarwal |
| 9,297,705 B2 | 3/2016 | Aggarwal |
| 9,299,557 B2 | 3/2016 | Tolle et al. |
| D753,269 S | 4/2016 | Yamagishi et al. |
| 9,343,343 B2 | 5/2016 | Mori |
| 9,412,582 B2 | 8/2016 | Sasaki et al. |
| D770,993 S | 11/2016 | Yoshida et al. |
| 9,484,191 B2 | 11/2016 | Winkler |
| 9,514,927 B2 | 12/2016 | Tolle et al. |
| 9,514,932 B2 | 12/2016 | Mallick et al. |
| D783,351 S | 4/2017 | Fujino et al. |
| D785,766 S | 5/2017 | Sato |
| D787,458 S | 5/2017 | Kim et al. |
| 9,640,448 B2 | 5/2017 | Ikegawa et al. |
| D789,888 S | 6/2017 | Jang et al. |
| 9,708,707 B2 | 7/2017 | Ditizio et al. |
| 9,708,708 B2 | 7/2017 | Isobe et al. |
| D793,572 S | 8/2017 | Kozuka et al. |
| 9,748,145 B1 | 8/2017 | Kannan et al. |
| D796,458 S | 9/2017 | Jang et al. |
| 9,759,489 B2 | 9/2017 | Kaneko |
| D802,546 S | 11/2017 | Jang et al. |
| 9,890,456 B2 | 2/2018 | Tolle et al. |
| 9,929,011 B2 | 3/2018 | Hawryluk et al. |
| 10,032,628 B2 | 6/2018 | Xie et al. |

(56) References Cited

U.S. PATENT DOCUMENTS

| | | |
|---|---|---|
| 10,023,960 B2 | 7/2018 | Alokozai |
| 10,032,792 B2 | 7/2018 | Kim et al. |
| 10,043,661 B2 | 8/2018 | Kato et al. |
| 10,083,836 B2 | 9/2018 | Milligan |
| D830,981 S | 10/2018 | Jeong et al. |
| 10,087,522 B2 | 10/2018 | Raisanen et al. |
| 10,087,525 B2 | 10/2018 | Schmotzer et al. |
| 10,090,316 B2 | 10/2018 | Ootsuka |
| 10,103,040 B1 | 10/2018 | Oosterlaken et al. |
| 2001/0003191 A1 | 6/2001 | Kovacs et al. |
| 2001/0038783 A1 | 11/2001 | Nakashima et al. |
| 2001/0040511 A1 | 11/2001 | Bushner et al. |
| 2001/0049080 A1 | 12/2001 | Asano |
| 2002/0005400 A1 | 1/2002 | Gat et al. |
| 2002/0009119 A1 | 1/2002 | Matthew et al. |
| 2002/0011211 A1 | 1/2002 | Halpin |
| 2002/0013792 A1 | 1/2002 | Imielinski et al. |
| 2002/0014483 A1 | 2/2002 | Suzuki et al. |
| 2002/0016829 A1 | 2/2002 | Defosse |
| 2002/0043337 A1 | 4/2002 | Goodman et al. |
| 2002/0064598 A1 | 5/2002 | Wang et al. |
| 2002/0069222 A1 | 6/2002 | McNeely |
| 2002/0109115 A1 | 8/2002 | Cederstav et al. |
| 2002/0112114 A1 | 8/2002 | Blair et al. |
| 2002/0136214 A1 | 9/2002 | Do et al. |
| 2002/0151327 A1 | 10/2002 | Levitt |
| 2002/0152244 A1 | 10/2002 | Dean et al. |
| 2002/0155219 A1 | 10/2002 | Wang et al. |
| 2002/0174106 A1 | 11/2002 | Martin |
| 2002/0184111 A1 | 12/2002 | Swanson |
| 2003/0002562 A1 | 1/2003 | Yerlikaya et al. |
| 2003/0010451 A1 | 1/2003 | Tzu |
| 2003/0029303 A1 | 2/2003 | Hasegawa et al. |
| 2003/0035002 A1 | 2/2003 | Moles |
| 2003/0036272 A1 | 2/2003 | Shamouilian et al. |
| 2003/0040841 A1 | 2/2003 | Nasr et al. |
| 2003/0049372 A1 | 3/2003 | Cook et al. |
| 2003/0065413 A1 | 4/2003 | Liteplo et al. |
| 2003/0082296 A1 | 5/2003 | Elers et al. |
| 2003/0109107 A1 | 6/2003 | Hsieh et al. |
| 2003/0109951 A1 | 6/2003 | Hsiung et al. |
| 2003/0168699 A1 | 9/2003 | Honda |
| 2003/0219972 A1 | 11/2003 | Green |
| 2003/0231698 A1 | 12/2003 | Yamaguchi |
| 2004/0010772 A1 | 1/2004 | McKenna et al. |
| 2004/0026372 A1 | 2/2004 | Takenaka et al. |
| 2004/0037675 A1 | 2/2004 | Zinger et al. |
| 2004/0087141 A1 | 5/2004 | Ramanathan et al. |
| 2004/0129671 A1 | 7/2004 | Ji et al. |
| 2004/0151844 A1 | 8/2004 | Zhang et al. |
| 2004/0231600 A1 | 11/2004 | Lee |
| 2004/0250600 A1 | 12/2004 | Bevers et al. |
| 2004/0253867 A1 | 12/2004 | Matsumoto |
| 2005/0000428 A1 | 1/2005 | Shero et al. |
| 2005/0042778 A1 | 2/2005 | Peukert |
| 2005/0092733 A1 | 5/2005 | Ito et al. |
| 2005/0098107 A1 | 5/2005 | Du Bois et al. |
| 2005/0101843 A1 | 5/2005 | Quinn et al. |
| 2005/0118837 A1 | 6/2005 | Todd |
| 2005/0130427 A1 | 6/2005 | Seok-Jun |
| 2005/0141591 A1 | 6/2005 | Sakano |
| 2005/0233477 A1 | 10/2005 | Yamazaki et al. |
| 2005/0245058 A1 | 11/2005 | Lee et al. |
| 2005/0263072 A1 | 12/2005 | Balasubramanian et al. |
| 2005/0285097 A1 | 12/2005 | Shang et al. |
| 2006/0013674 A1 | 1/2006 | Elliott et al. |
| 2006/0026314 A1 | 2/2006 | Franchuk et al. |
| 2006/0040054 A1 | 2/2006 | Pearlstein et al. |
| 2006/0068104 A1 | 3/2006 | Ishizaka |
| 2006/0128142 A1 | 6/2006 | Whelan et al. |
| 2006/0156981 A1 | 7/2006 | Fondurulia |
| 2006/0166428 A1 | 7/2006 | Kamioka |
| 2006/0175669 A1 | 8/2006 | Kim et al. |
| 2006/0188360 A1 | 8/2006 | Bonora et al. |
| 2006/0211259 A1 | 9/2006 | Maes |
| 2006/0216942 A1 | 9/2006 | Kim et al. |
| 2006/0252351 A1 | 11/2006 | Kundracik |
| 2006/0269690 A1 | 11/2006 | Watanabe et al. |
| 2006/0275933 A1 | 12/2006 | Du Bois et al. |
| 2007/0012402 A1 | 1/2007 | Sneh |
| 2007/0032045 A1* | 2/2007 | Kasahara ............ C23C 16/4401 438/478 |
| 2007/0034477 A1 | 2/2007 | Inui |
| 2007/0062439 A1 | 3/2007 | Wada et al. |
| 2007/0066038 A1 | 3/2007 | Sadjadi et al. |
| 2007/0066084 A1 | 3/2007 | Wajda et al. |
| 2007/0119370 A1 | 5/2007 | Ma et al. |
| 2007/0123189 A1 | 5/2007 | Saito et al. |
| 2007/0129621 A1 | 6/2007 | Kellogg et al. |
| 2007/0137794 A1 | 6/2007 | Qiu et al. |
| 2007/0202678 A1 | 8/2007 | Plombon et al. |
| 2007/0258506 A1 | 11/2007 | Schwagerman et al. |
| 2007/0266945 A1 | 11/2007 | Shuto et al. |
| 2007/0269983 A1 | 11/2007 | Sneh |
| 2008/0020593 A1 | 1/2008 | Wang et al. |
| 2008/0031708 A1 | 2/2008 | Bonora et al. |
| 2008/0038485 A1 | 2/2008 | Fuzakawa et al. |
| 2008/0042165 A1 | 2/2008 | Sugizaki |
| 2008/0043803 A1 | 2/2008 | Bandoh |
| 2008/0056860 A1 | 3/2008 | Natume |
| 2008/0075562 A1 | 3/2008 | Maria et al. |
| 2008/0118334 A1 | 5/2008 | Bonora |
| 2008/0121626 A1 | 5/2008 | Thomas et al. |
| 2008/0132046 A1 | 6/2008 | Walther |
| 2008/0202689 A1 | 8/2008 | Kim |
| 2008/0205483 A1 | 8/2008 | Rempe et al. |
| 2008/0228306 A1 | 9/2008 | Yetter et al. |
| 2008/0241387 A1 | 10/2008 | Keto |
| 2008/0268635 A1 | 10/2008 | Yu et al. |
| 2008/0289574 A1 | 11/2008 | Jacobs et al. |
| 2008/0291964 A1 | 11/2008 | Shrimpling |
| 2008/0299758 A1 | 12/2008 | Harada et al. |
| 2009/0017631 A1 | 1/2009 | Bencher |
| 2009/0042408 A1 | 2/2009 | Maeda |
| 2009/0052498 A1 | 2/2009 | Halpin et al. |
| 2009/0095221 A1 | 4/2009 | Tam et al. |
| 2009/0108308 A1 | 4/2009 | Yang et al. |
| 2009/0112458 A1 | 4/2009 | Nakai |
| 2009/0122458 A1 | 5/2009 | Lischer et al. |
| 2009/0124131 A1 | 5/2009 | Breunsbach et al. |
| 2009/0130859 A1 | 5/2009 | Itatani et al. |
| 2009/0159000 A1 | 6/2009 | Aggarwal et al. |
| 2009/0179365 A1 | 7/2009 | Lerner et al. |
| 2009/0186571 A1 | 7/2009 | Haro |
| 2009/0204403 A1 | 8/2009 | Hollander et al. |
| 2009/0236276 A1 | 9/2009 | Kurth et al. |
| 2009/0302434 A1 | 12/2009 | Pallem et al. |
| 2009/0308315 A1 | 12/2009 | de Ridder |
| 2009/0308425 A1 | 12/2009 | Yednak |
| 2010/0032587 A1 | 2/2010 | Hosch et al. |
| 2010/0032842 A1 | 2/2010 | Herdt et al. |
| 2010/0040441 A1 | 2/2010 | Obikane |
| 2010/0051597 A1 | 3/2010 | Morita et al. |
| 2010/0075037 A1* | 3/2010 | Marsh ..................... C23C 16/40 427/255.28 |
| 2010/0081094 A1 | 4/2010 | Hasebe et al. |
| 2010/0105936 A1 | 4/2010 | Tada et al. |
| 2010/0112496 A1 | 5/2010 | Nakajima et al. |
| 2010/0144968 A1 | 6/2010 | Lee et al. |
| 2010/0145547 A1 | 6/2010 | Darabnia et al. |
| 2010/0159707 A1 | 6/2010 | Huang et al. |
| 2010/0170868 A1 | 7/2010 | Lin et al. |
| 2010/0230863 A1 | 9/2010 | Moench et al. |
| 2010/0233885 A1 | 9/2010 | Kushibiki et al. |
| 2010/0255218 A1 | 10/2010 | Oka et al. |
| 2010/0246630 A1 | 11/2010 | Kaszynski et al. |
| 2010/0282163 A1 | 11/2010 | Aggarwal et al. |
| 2010/0285237 A1 | 11/2010 | Ditizio et al. |
| 2010/0326358 A1 | 12/2010 | Choi |
| 2011/0046314 A1 | 2/2011 | Klipp et al. |
| 2011/0139272 A1 | 6/2011 | Matsumoto et al. |
| 2011/0198417 A1 | 8/2011 | Detmar et al. |
| 2011/0298062 A1 | 12/2011 | Ganguli et al. |
| 2012/0028454 A1 | 2/2012 | Swaminathan et al. |

(56) References Cited

U.S. PATENT DOCUMENTS

| | | |
|---|---|---|
| 2012/0033695 A1 | 2/2012 | Hayashi et al. |
| 2012/0064690 A1 | 3/2012 | Hirota et al. |
| 2012/0074533 A1 | 3/2012 | Aoyama |
| 2012/0088031 A1 | 4/2012 | Neel |
| 2012/0115250 A1 | 5/2012 | Ariga et al. |
| 2012/0119337 A1 | 5/2012 | Sasaki et al. |
| 2012/0183689 A1 | 7/2012 | Suzuki et al. |
| 2012/0216743 A1 | 8/2012 | Itoh et al. |
| 2012/0231771 A1 | 9/2012 | Marcus |
| 2012/0252229 A1 | 10/2012 | Timans et al. |
| 2012/0264051 A1 | 10/2012 | Angelov et al. |
| 2012/0305026 A1 | 12/2012 | Nomura et al. |
| 2012/0310440 A1 | 12/2012 | Darabnia et al. |
| 2013/0020246 A1 | 1/2013 | Hoots et al. |
| 2013/0025786 A1 | 1/2013 | Davidkovich et al. |
| 2013/0026451 A1 | 1/2013 | Bangsaruntip et al. |
| 2013/0037858 A1 | 2/2013 | Hong et al. |
| 2013/0065189 A1 | 3/2013 | Yoshii et al. |
| 2013/0143401 A1 | 6/2013 | Yu et al. |
| 2013/0189854 A1 | 7/2013 | Hausmann et al. |
| 2013/0270676 A1 | 10/2013 | Lindert et al. |
| 2013/0288485 A1 | 10/2013 | Liang et al. |
| 2013/0295779 A1 | 11/2013 | Chandra et al. |
| 2014/0061770 A1 | 3/2014 | Lee |
| 2014/0076861 A1 | 3/2014 | Cornelius et al. |
| 2014/0144500 A1 | 5/2014 | Cao et al. |
| 2014/0167187 A1 | 6/2014 | Kuo et al. |
| 2014/0191389 A1 | 7/2014 | Lee et al. |
| 2014/0260684 A1 | 9/2014 | Christmann |
| 2014/0272194 A1 | 9/2014 | Xiao et al. |
| 2014/0346142 A1 | 11/2014 | Chapuis et al. |
| 2015/0014823 A1 | 1/2015 | Mallikarjunan et al. |
| 2015/0041431 A1 | 2/2015 | Zafiropoulo et al. |
| 2015/0072509 A1 | 3/2015 | Chi et al. |
| 2015/0099065 A1 | 4/2015 | Canizares et al. |
| 2015/0102466 A1 | 4/2015 | Colinge |
| 2015/0147488 A1 | 5/2015 | Choi et al. |
| 2015/0171177 A1 | 6/2015 | Cheng et al. |
| 2015/0179564 A1 | 6/2015 | Lee et al. |
| 2015/0225850 A1 | 8/2015 | Arora et al. |
| 2015/0255385 A1 | 9/2015 | Lee et al. |
| 2015/0263033 A1 | 9/2015 | Aoyama |
| 2015/0287710 A1 | 10/2015 | Yun et al. |
| 2015/0292088 A1 | 10/2015 | Canizares |
| 2015/0303056 A1 | 11/2015 | Varadarajan et al. |
| 2015/0340247 A1 | 11/2015 | Balakrishnan et al. |
| 2015/0340500 A1 | 11/2015 | Brunco |
| 2015/0348755 A1 | 12/2015 | Han et al. |
| 2015/0380296 A1 | 12/2015 | Antonelli et al. |
| 2016/0020092 A1 | 1/2016 | Kang et al. |
| 2016/0079054 A1 | 3/2016 | Chen et al. |
| 2016/0102214 A1 | 4/2016 | Dietz et al. |
| 2016/0111438 A1 | 4/2016 | Tsutsumi et al. |
| 2016/0115590 A1 | 4/2016 | Haukka et al. |
| 2016/0148811 A1 | 5/2016 | Nakatani et al. |
| 2016/0155629 A1 | 6/2016 | Hawryluk et al. |
| 2016/0163556 A1 | 6/2016 | Briggs et al. |
| 2016/0168699 A1 | 6/2016 | Fukazawa et al. |
| 2016/0181368 A1 | 6/2016 | Weeks |
| 2016/0245704 A1 | 8/2016 | Osaka et al. |
| 2016/0293398 A1 | 10/2016 | Danek et al. |
| 2016/0307766 A1 | 10/2016 | Jongbloed et al. |
| 2016/0312360 A1 | 10/2016 | Rasheed et al. |
| 2016/0314964 A1 | 10/2016 | Tang et al. |
| 2016/0334709 A1 | 11/2016 | Huli et al. |
| 2016/0365280 A1 | 12/2016 | Brink et al. |
| 2016/0372365 A1 | 12/2016 | Tang et al. |
| 2016/0372744 A1 | 12/2016 | Essaki et al. |
| 2017/0011889 A1 | 1/2017 | Winkler |
| 2017/0029945 A1 | 2/2017 | Kamakura |
| 2017/0033004 A1 | 2/2017 | Siew et al. |
| 2017/0051408 A1 | 2/2017 | Kosuke et al. |
| 2017/0062204 A1 | 3/2017 | Suzuki et al. |
| 2017/0092847 A1 | 3/2017 | Kim et al. |
| 2017/0114464 A1 | 4/2017 | Iriuda |
| 2017/0117222 A1 | 4/2017 | Kim et al. |
| 2017/0191164 A1 | 7/2017 | Alokozai et al. |
| 2017/0232457 A1 | 8/2017 | Toshiki et al. |
| 2017/0243734 A1 | 8/2017 | Ishikawa et al. |
| 2017/0250075 A1 | 8/2017 | Caymax et al. |
| 2017/0263437 A1 | 9/2017 | Li et al. |
| 2017/0267527 A1 | 9/2017 | Kim et al. |
| 2017/0271256 A1 | 9/2017 | Inatsuka |
| 2017/0287681 A1 | 10/2017 | Nitadori et al. |
| 2017/0294318 A1 | 10/2017 | Yoshida et al. |
| 2017/0338192 A1 | 11/2017 | Lee et al. |
| 2017/0343896 A1 | 11/2017 | Darling et al. |
| 2018/0033645 A1 | 2/2018 | Saido et al. |
| 2018/0033679 A1 | 2/2018 | Pore |
| 2018/0040746 A1 | 2/2018 | Johnson et al. |
| 2018/0076021 A1 | 3/2018 | Fukushima et al. |
| 2018/0087152 A1 | 3/2018 | Yoshida |
| 2018/0087154 A1 | 3/2018 | Pore et al. |
| 2018/0087156 A1 | 3/2018 | Kohei et al. |
| 2018/0105930 A1 | 4/2018 | Kang et al. |
| 2018/0122959 A1 | 5/2018 | Calka et al. |
| 2018/0130652 A1 | 5/2018 | Pettinger et al. |
| 2018/0135173 A1 | 5/2018 | Kim et al. |
| 2018/0135179 A1 | 5/2018 | Toshiyuki et al. |
| 2018/0142353 A1 | 5/2018 | Tetsuya et al. |
| 2018/0142357 A1 | 5/2018 | Yoshikazu |
| 2018/0151358 A1 | 5/2018 | Margetis et al. |
| 2018/0166258 A1 | 6/2018 | Kim et al. |
| 2018/0166315 A1 | 6/2018 | Coomer |
| 2018/0171475 A1 | 6/2018 | Maes et al. |
| 2018/0171477 A1 | 6/2018 | Kim et al. |
| 2018/0174826 A1 | 6/2018 | Raaijmakers et al. |
| 2018/0182613 A1 | 6/2018 | Blanquart et al. |
| 2018/0182618 A1 | 6/2018 | Blanquart et al. |
| 2018/0189923 A1 | 7/2018 | Zhong et al. |
| 2018/0195174 A1 | 7/2018 | Kim et al. |
| 2018/0223429 A1 | 8/2018 | Fukazawa et al. |
| 2018/0233372 A1 | 8/2018 | Vayrynen et al. |

FOREIGN PATENT DOCUMENTS

| | | |
|---|---|---|
| CN | 101681873 | 3/2010 |
| EP | 0887632 | 12/1998 |
| EP | 1889817 | 2/2008 |
| FR | 1408266 | 8/1965 |
| FR | 2233614 | 1/1975 |
| GB | 752-277 | 7/1956 |
| JP | 58-19462 | 4/1983 |
| JP | 59-211779 | 11/1984 |
| JP | H02-185038 | 7/1990 |
| JP | H05-023079 | 3/1993 |
| JP | H05-118928 | 5/1993 |
| JP | H06-053210 | 2/1994 |
| JP | H07297271 | 1/1995 |
| JP | H07-109576 | 4/1995 |
| JP | H07-034936 | 8/1995 |
| JP | H07-209093 | 11/1995 |
| JP | H08181135 | 7/1996 |
| JP | 9-89676 | 4/1997 |
| JP | H10-153494 | 6/1998 |
| JP | H10-227703 | 8/1998 |
| JP | H11-118615 | 4/1999 |
| JP | H11-183264 | 7/1999 |
| JP | H11-183265 | 7/1999 |
| JP | H11-287715 | 10/1999 |
| JP | 2003035574 | 2/2003 |
| JP | 2003153706 | 5/2003 |
| JP | 2004023043 | 1/2004 |
| JP | 2004113270 | 4/2004 |
| JP | 2005033221 | 2/2005 |
| JP | 2005172489 | 6/2005 |
| JP | 2006059931 | 3/2006 |
| JP | 2006090762 | 4/2006 |
| JP | 2006153706 | 6/2006 |
| JP | 2007027777 | 2/2007 |
| JP | 2009088421 | 4/2009 |
| JP | 2009194248 | 8/2009 |
| JP | 2016174158 | 9/2016 |
| KR | 10-2000-0031098 | 6/2000 |

(56) References Cited

FOREIGN PATENT DOCUMENTS

| KR | 10-2000-0045257 | 7/2000 |
|---|---|---|
| KR | 2002-0086763 | 11/2002 |
| KR | 2003-0092305 | 12/2003 |
| KR | 10-0547248 | 1/2006 |
| KR | 10-0593960 | 6/2006 |
| KR | 10-0688484 | 2/2007 |
| KR | 10-1114219 | 3/2012 |
| TW | 538327 | 6/2003 |
| TW | M292692 | 6/2006 |
| TW | 200731357 | 8/2007 |
| TW | 201247690 | 12/2012 |
| WO | 1999023690 | 5/1999 |
| WO | DM/048579 | 7/1999 |
| WO | 2004008491 | 7/2002 |
| WO | 2005112082 | 11/2005 |
| WO | 2007117718 | 10/2007 |
| WO | 2008121463 | 10/2008 |
| WO | 2008147731 | 12/2008 |
| WO | 2009028619 | 3/2009 |
| WO | 2009154896 | 12/2009 |
| WO | 2010077533 | 7/2010 |
| WO | 2010129428 | 11/2010 |
| WO | 2010129430 | 11/2010 |
| WO | 2010129431 | 11/2010 |
| WO | 2018109553 | 6/2016 |
| WO | 2018109554 | 6/2016 |
| WO | 2017108713 | 6/2017 |
| WO | 2017212546 | 12/2017 |
| WO | 2018008088 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2008045972 | 4/2018 |
| WO | 2018109551 | 6/2018 |
| WO | 2018109552 | 6/2018 |

OTHER PUBLICATIONS

USPTO; Non-Final Office Action dated Sep. 20, 2018 in U.S. Appl. No. 13/651,144.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Notice of Allowance dated Aug. 29, 2018 in U.S. Appl. No. 14/090,750.
USPTO; Notice of Allowance dated Sep. 24, 2018 in U.S. Appl. No. 14/218,690.
USPTO; Final Office Action dated Sep. 5, 2018 in U.S. Appl. No. 14/752,712.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Notice of Allowance dated Oct. 20, 2017 in U.S. Appl. No. 14/884,695.
USPTO; Notice of Allowance dated Oct. 4, 2018 in U.S. Appl. No. 14/919,536.
USPTO; Non-Final Office Action dated Aug. 27, 2018 in U.S. Appl. No. 15/067,028.
USPTO; Notice of Allowance dated Oct. 14, 2018 in U.S. Appl. No. 15/135,333.
USPTO; Notice of Allowance dated May 22, 2017 in U.S. Appl. No. 15/222,738.
USPTO; Notice of Allowance dated Sep. 10, 2018 in U.S. Appl. No. 15/222,749.
USPTO; Non-Final Office Action dated Oct. 1, 2018 in U.S. Appl. No. 15/222,780.
USPTO; Non-Final Office Action dated Sep. 13, 2018 in U.S. Appl. No. 15/262,990.
USPTO; Non-Final Office Action dated Oct. 3, 2017 in U.S. Appl. No. 15/388,410.
USPTO; Non-Final Office Action dated Sep. 20, 2018 in U.S. Appl. No. 15/410,503.
USPTO; Final Office Action dated Aug. 29, 2018 in U.S. Appl. No. 15/434,051.
USPTO; Non-Final Office Action dated Sep. 10, 2018 in U.S. Appl. No. 15/489,453.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Sep. 21, 2017 in U.S. Appl. No. 15/659,631.
USPTO; Non-Final Office Action dated Aug. 27, 2018 in U.S. Appl. No. 15/662,107.
USPTO; Requirement for Restriction dated Sep. 11, 2018 in U.S. Appl. No. 15/672,063.
USPTO; Requirement for Restriction dated Aug. 14, 2018 in U.S. Appl. No. 15/705,955.
USPTO; Non-Final Office Action dated Oct. 4, 2018 in U.S. Appl. No. 15/726,222.
USPTO; Restriction Requirement dated Aug. 31, 2018 in U.S. Appl. No. 15/795,056.
USPTO; Non-Final Office Action dated Jun. 26, 2018 in U.S. Appl. No. 15/796,693.
USPTO; Non-Final Office Action dated Sep. 10, 2018 in U.S. Appl. No. 15/836,547.
European Patent Office; Office Action dated Aug. 10, 2018 in Application No. 09767208.3.
Korean Patent Office; Office Action dated Apr. 2, 2018 in Application No. 10-2011-0036449.
Korean Patent Office; Office Action dated Sep. 18, 2018 in Application No. 10-2012-0064526.
Korean Patent Office; Office Action dated Sep. 27, 2018 in Application No. 10-2012-0076564.
Korean Patent Office; Office Action dated Sep. 28, 2017 in Application No. 10-2017-7023740.
Taiwanese Patent Office; Office Action dated Sep. 26, 2018 in Application No. 103132230.
Taiwanese Patent Office; Office Action dated May 21, 2018 Application No. 103139014.
Taiwanese Patent Office; Office Action dated Jul. 9, 2018 in Application No. 104107876.
Taiwanese Patent Office; Office Action dated Aug. 7, 2018 Application No. 104107888.
Taiwanese Patent Office; Office Action dated Jul. 9, 2018 in Application No. 104110326.
Taiwanese Patent Office; Office Action dated Jul. 11, 2018 in Application No. 104124377.
Taiwanese Patent Office; Office Action dated Jun. 25, 2018 in Application No. 106138800.
Taiwanese Patent Office; Office Action dated Aug. 31, 2018 in Application No. 10720809210.
WIPO; International Search Report and Written Opinion dated Jul. 9, 2018 in Application No. PCT/IB2018/000419.
WIPO; International Search Report and Written Opinion dated Sep. 14, 2018 in Application No. PCT/IB2017/001640.
Crystal IS "Application Note: Using UV Reflective Materials to Maximize Disinfection"; AN011; Jun. 16, 2016.
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703.
Liang et al. "Conversion of Metal Carbides to Carbide Derived Carbon by Reactive Ion Etching in Halogen Gas" Micro (MEMS) and Nanotechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2.
Sellers, Making Your Own Timber Dogs, Paul Sellers blog, Published on Nov. 18, 2014, [online], [site visited Jun. 10, 2017]. Available from Internet, <URL:.

(56) References Cited

OTHER PUBLICATIONS

"Polyurethane HF"; webpage; no date. Cited in Notice of References Cited by Examiner dated May 18, 2017 in U.S. Appl. No. 14/884,695.
Xu et al., "14NM Metal Gate Film Stack Development and Challenges," Smic et al. (2016).
PCT; International Preliminary Report on Patentability dated Nov. 24, 2009 and International Search Report dated Jul. 31, 208 in Application No. PCT/US2008/063919.
PCT; International Preliminary Report on Patentability dated Feb. 24, 2010 in Application No. PCT/US2008/074063.
PCT; International Preliminary Report on Patentability dated Nov. 26, 2009 in Application No. PCT/US2009/043454.
PCT; International Preliminary Report on Patentability dated Jun. 14, 2011 in Application No. PCT/US2009/066377.
PCT; International Preliminary Report on Patentability dated Nov. 9, 2011 in Application No. PCT/US2010/033244.
PCT; International Preliminary Report on Patentability dated Nov. 9, 2011 in Application No. PCT/US2010/033248.
PCT; International Preliminary Report on Patentability dated Nov. 9, 2011 in Application No. PCT/US2010/033252.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Non-Final Office Action dated Mar. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Requirement for Restriction dated Sep. 10, 2010 in U.S. Appl. No. 12/148,956.
USPTO; Non-Final Office Action dated Mar. 15, 2011 in U.S. Appl. No. 12/193,924.
USPTO; Final Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO ; Non-Final Office Action dated Jul. 28, 2011 in U.S. Appl. No. 12/330,096.
USPTO ; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Restriction Requirement dated Dec. 20, 2011 in U.S. Appl. No. 12/436,306.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Advisory Action dated Oct. 1, 2014 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Advisory Action dated Jul. 13, 2011 in U.S. Appl. No. 12/553,759.
USPTO; Advisory Action dated Jul. 23, 2013 in U.S. Appl. No. 12/618,355.
USPTO; Advisory Action dated Mar. 4, 2016 in U.S. Appl. No. 12/618,355.
USPTO; Advisory Action dated May 16, 2017 in U.S. Appl. No. 12/618,355.
USPTO; Final Office Action dated Aug. 10, 2018 in U.S. Appl. No. 12/618,355.
USPTO; Advisory Action dated Aug. 9, 2012 in U.S. Appl. No. 12/618,419.

(56) References Cited

OTHER PUBLICATIONS

USPTO; Notice of Allowance dated Oct. 9, 2013 in U.S. Appl. No. 12/618,419.
USPTO; Requirement for Restriction dated Sep. 12, 2011 in U.S. Appl. No. 12/718,731.
USPTO; Advisory Action dated Jul. 1, 2013 in U.S. Appl. No. 12/847,848.
USPTO; Requirement for Restriction dated Jul. 22, 2013 in U.S. Appl. No. 12/910,607.
USPTO; Advisory Action dated Jul. 9, 2014 in U.S. Appl. No. 12/910,607.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Advisory Action dated Jun. 12, 2014 in U.S. Appl. No. 13/102,980.
USPTO; Notice of Allowance dated Sep. 17, 2014 in U.S. Appl. No. 13/102,980.
USPTO; Requirement for Restriction dated Jun. 5, 2014 in U.S. Appl. No. 13/154,271.
USPTO; Requirement for Restriction dated Apr. 6, 2016 in U.S. Appl. No. 13/166,367.
USPTO; Advisory Action dated Apr. 21, 2017 in U.S. Appl. No. 13/166,367.
USPTO; Requirement for Restriction dated Jun. 18, 2014 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Advisory Action dated Feb. 8, 2018 in U.S. Appl. No. 13/169,951.
USPTO; Advisory Action dated Dec. 17, 2014 in U.S. Appl. No. 13/181,407.
USPTO; Requirement for Restriction dated Sep. 25, 2012 in U.S. Appl. No. 13/184,351.
USPTO; Advisory Action dated Nov. 7, 2013 in U.S. Appl. No. 13/184,351.
USPTO; Advisory Action dated May 18, 2015 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Restriction Requirement dated Aug. 21, 2014 in U.S. Appl. No. 13/187,300.
USPTO; Advisory Action dated Mar. 28, 2016 in U.S. Appl. No. 13/283,408.
USPTO; Restriction Requirement dated Oct. 2, 2013 in U.S. Appl. No. 13/312,591.
USPTO; Advisory Action dated Aug. 26, 2014 in U.S. Appl. No. 13/312,591.
USPTO; Notice of Allowance dated Jun. 11, 2015 in U.S. Appl. No. 13/312,591.
USPTO; Requirement for Restriction dated Nov. 26, 2013 in U.S. Appl. No. 13/333,420.
USPTO; Advisory Action dated Mar. 27, 2013 in U.S. Appl. No. 13/406,791.
USPTO; Advisory Action dated Oct. 29, 2013 in U.S. Appl. No. 13/406,791.
USPTO; Advisory Action dated Apr. 22, 2015 in U.S. Appl. No. 13/411,271.
USPTO; Advisory Action dated Mar. 31, 2014 in U.S. Appl. No. 13/550,419.
USPTO; Advisory Action dated Apr. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Advisory Action dated May 5, 2014 in U.S. Appl. No. 13/565,564.
USPTO; Notice of Allowance dated Sep. 13, 2013 in U.S. Appl. No. 13/566,069.
USPTO; Advisory Action dated Sep. 2, 2015 in U.S. Appl. No. 13/597,108.
USPTO; Notice of Allowance dated Mar. 7, 2017 in U.S. Appl. No. 13/597,108.
USPTO; Restriction Requirement dated Jul. 9, 2013 in U.S. Appl. No. 13/612,538.
USPTO; Notice of Allowance dated Feb. 25, 2015 in U.S. Appl. No. 13/612,538.
USPTO; Requirement for Restriction dated Feb. 4, 2015 in U.S. Appl. No. 13/646,403.
USPTO; Requirement for Restriction dated Apr. 11, 2014 in U.S. Appl. No. 13/646,471.
USPTO; Advisory Action dated Nov. 14, 2014 in U.S. Appl. No. 13/646,471.
USPTO; Advisory Action dated Apr. 15, 2016 in U.S. Appl. No. 13/646,471.
USPTO; Final Office Action dated Oct. 20, 2016 in U.S. Appl. No. 13/646,471.
USPTO; Restriction Requirement dated Mar. 4, 2015 in U.S. Appl. No. 13/651,144.
USPTO; Advisory Action dated Apr. 19, 2018 in U.S. Appl. No. 13/651,144.
USPTO; Requirement for Restriction dated Dec. 24, 2014 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in Application No. 13/665,366.
USPTO; Notice of Allowance dated Aug. 24, 2015 in Application No. 13/677,133.
USPTO; Notice of Allowance dated Mar. 17, 2015 in U.S. Appl. No. 13/677,151.
USPTO; Advisory Action dated Apr. 6, 2016 in U.S. Appl. No. 13/727,324.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Advisory Action dated Jul. 13, 2016 in U.S. Appl. No. 13/791,246.
USPTO; Notice of Allowance dated Oct. 19, 2016 in U.S. Appl. No. 13/791,246.
USPTO; Advisory Action dated Jul. 14, 2016 in U.S. Appl. No. 13/791,339.
USPTO; Advisory Action dated Jun. 29, 2015 in U.S. Appl. No. 13/901,372.
USPTO; Advisory Action dated Dec. 11, 2014 in U.S. Appl. No. 13/912,666.

(56) References Cited

OTHER PUBLICATIONS

USPTO; Requirement for Restriction dated Sep. 4, 2014 in U.S. Appl. No. 13/915,732.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Notice of Allowance dated Mar. 21, 2016 in U.S. Appl. No. 13/966,782.
USPTO; Non-Final Office Action Restriction dated Jan. 2, 2015 in U.S. Appl. No. 14/040,196.
USPTO; Advisory Action dated Aug. 24, 2015 in U.S. Appl. No. 14/065,114.
USPTO; Non-Final Office Action dated Dec. 23, 2015 in U.S. Appl. No. 14/079,302.
USPTO; Requirement for Restriction dated Aug. 11, 2015 in U.S. Appl. No. 14/090,750.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Advisory Action dated Feb. 20, 2015 in U.S. Appl. No. 14/183,187.
USPTO; Notice of Allowance dated Aug. 31, 2015 in U.S. Appl. No. 14/183,187.
USPTO; Requirement for Restriction dated Sep. 24, 2015 in U.S. Appl. No. 14/188,760.
USPTO; Advisory Action dated Jan. 12, 2017 in U.S. Appl. No. 14/188,760.
USPTO; Advisory Action dated Jan. 3, 2018 in U.S. Appl. No. 14/188,760.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Advisory Action dated Jun. 30, 2016 in U.S. Appl. No. 14/219,839.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Final Office action dated Jul. 6, 2017 in U.S. Appl. No. 14/219,879.
USPTO; Advisory Action dated Aug. 2, 2016 in U.S. Appl. No. 14/246,969.
USPTO; Notice of Allowance dated Feb. 27, 2017 in U.S. Appl. No. 14/246,969.
USPTO; Requirement for Restriction dated Jun. 15, 2015 in U.S. Appl. No. 14/268,348.
USPTO; Notice of Allowance dated Aug. 30, 2016 in U.S. Appl. No. 14/268,348.
USPTO; Requirement for Restriction dated May 21, 2015 in U.S. Appl. No. 14/281,477.
USPTO; Advisory Action dated Mar. 28, 2016 in U.S. Appl. No. 14/281,477.
USPTO; Non-Final Office Action dated Jul. 27, 2018 in U.S. Appl. No. 14/444,744.
USPTO; Notice of Allowance dated Nov. 28, 2016 in U.S. Appl. No. 14/449,838.
USPTO; Advisory Action dated Sep. 21, 2016 in U.S. Appl. No. 14/457,058.
USPTO; Final Office Action dated Jun. 14, 2018 in U.S. Appl. No. 14/457,058.
USPTO; Requirement for Restriction dated Sep. 3, 2015 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Requirement for Restriction dated Mar. 20, 2015 in U.S. Appl. No. 14/505,290.
USPTO; Advisory Action dated Aug. 17, 2016 in U.S. Appl. No. 14/508,296.
USPTO; Notice of Allowance dated Jan. 27, 2017 in U.S. Appl. No. 14/508,296.
USPTO; Advisory Action dated Dec. 21, 2016 in U.S. Appl. No. 14/568,647.
USPTO; Advisory Action dated Apr. 12, 2018 in U.S. Appl. No. 14/568,647.
USPTO; Notice of Allowance dated May 18, 2016 in U.S. Appl. No. 14/571,126.
USPTO; Restriction Requirement dated Mar. 7, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Non-Final Office Action dated Sep. 27, 2016 in U.S. Appl. No. 14/606,364.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Final Office Action dated Aug. 10, 2018 in U.S. Appl. No. 14/645,234.
USPTO; Requirement for Restriction dated Oct. 26, 2015 in U.S. Appl. No. 14/659,152.
USPTO; Final Office Action dated Mar. 17, 2016 in U.S. Appl. No. 14/659,437.
USPTO; Non-Final Office Action dated Aug. 10, 2018 in U.S. Appl. No. 14/793,323.
USPTO; Notice of Allowance dated Jun. 27, 2018 in U.S. Appl. No. 14/808,979.
USPTO; Notice of Allowance dated Jul. 11, 2018 in U.S. Appl. No. 14/817,953.
USPTO; Requirement for Restriction dated Mar. 17, 2016 in U.S. Appl. No. 14/827,177.
USPTO; Notice of Allowance dated Jan. 27, 2017 in U.S. Appl. No. 14/827,177.
USPTO; Requirement for Restriction dated Aug. 8, 2016 in U.S. Appl. No. 14/829,565.
USPTO; Advisory Action dated Apr. 20, 2017 in U.S. Appl. No. 14/829,565.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.

(56) References Cited

OTHER PUBLICATIONS

USPTO; Requirement for Restriction dated Dec. 1, 2016 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Requirement for Restriction dated Sep. 20, 2016 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Requirement for Restriction dated Sep. 15, 2016 in U.S. Appl. No. 14/938,180.
USPTO; Notice of Allowance dated Nov. 21, 2016 in U.S. Appl. No. 14/981,434.
USPTO; Notice of Allowance dated Jun. 7, 2017 in U.S. Appl. No. 14/981,468.
USPTO; Non-Final Office Action dated Jun. 20, 2018 in U.S. Appl. No. 14/997,683.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Requirement for Restriction dated Jun. 28, 2018 in U.S. Appl. No. 15/074,813.
USPTO; Notice of Allowance dated Jun. 29, 2018 in U.S. Appl. No. 15/135,224.
USPTO; Final Office Action dated Jul. 6, 2018 in U.S. Appl. No. 15/135,258.
USPTO; Final Office Action dated Jul. 26, 2018 in U.S. Appl. No. 15/144,506.
USPTO; Requirement for Restriction dated Jun. 22, 2018 in U.S. Appl. No. 15/182,504.
USPTO; Advisory Action dated Aug. 23, 2017 in U.S. Appl. No. 15/203,632.
USPTO; Requirement for Restriction dated Jan. 26, 2017 in U.S. Appl. No. 15/205,890.
USPTO; Requirement for Restriction dated Apr. 3, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Notice of Allowance dated Feb. 3, 2017 in U.S. Appl. No. 15/222,738.
USPTO; Notice of Allowance dated Aug. 23, 2017 in U.S. Appl. No. 15/222,738.
USPTO; Requirement for Restriction dated Dec. 5, 2017 in U.S. Appl. No. 15/254,605.
USPTO; Notice of Allowance dated Jul. 12, 2018 in U.S. Appl. No. 15/254,605.
USPTO; Notice of Allowance dated Apr. 2, 2018 in U.S. Appl. No. 15/254,724.
USPTO; Non-Final Office Action dated Aug. 3, 2018 in U.S. Appl. No. 15/273,488.
USTPO; Non-Final Office Action dated Jul. 2, 2018 in U.S. Appl. No. 15/286,503.
USPTO; Requirement for Restriction dated Sep. 12, 2017 in U.S. Appl. No. 15/377,439.
USPTO; Advisory Action dated Aug. 8, 2018 in U.S. Appl. No. 15/377,439.
USPTO; Notice of Allowance dated Oct. 11, 2017 in U.S. Appl. No. 15/380,895.
USPTO; Requirement for Restriction dated Sep. 21, 2017 in U.S. Appl. No. 15/380,921.
USPTO; Final Office Action dated Jun. 28, 2018 in U.S. Appl. No. 15/380,921.
USPTO; Final Office Action dated May 15, 2018 in U.S. Appl. No. 15/388,410.
USPTO; Notice of Allowance dated Dec. 22, 2017 in U.S. Appl. No. 15/397,237.
USPTO; Non-Final Office Action dated Aug. 7, 2018 in U.S. Appl. No. 15/428,808.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Notice of Allowance dated Dec. 19, 2017 in U.S. Appl. No. 15/489,660.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Requirement of Restriction dated Mar. 30, 2018 in U.S. Appl. No. 15/589,849.
USPTO; Office Action dated Aug. 30, 2018 in U.S. Appl. No. 15/589,849.
USPTO; Office Action dated May 3, 2018 in U.S. Appl. No. 15/589,861.
USPTO; Requirement for Restriction dated Aug. 1, 2018 in U.S. Appl. No. 15/627,189.
USPTO; Non-Final Office Action dated Jun. 5, 2018 in U.S. Appl. No. 15/650,686.
USPTO; Requirement for Restriction dated Apr. 6, 2018 in U.S. Appl. No. 15/659,631.
USPTO; Non-Final Office Action dated Aug. 9, 2018 in U.S. Appl. No. 15/660,805.
USPTO; Non-Final Office Action dated Jul. 27, 2018 in U.S. Appl. No. 15/673,110.
USPTO; Final Office Action dated Aug. 24, 2018 in U.S. Appl. No. 15/683,701.
USPTO; Non-Final Office Action dated Aug. 9, 2018 in U.S. Appl. No. 15/691,241.
USPTO; Requirement for Restriction dated Jul. 11, 2018 in U.S. Appl. No. 15/707,786.
USPTO; Non-Final Office Action dated May 29, 2018 in U.S. Appl. No. 15/719,208.
USPTO; Non-Final Office Action dated May 17, 2018 in U.S. Appl. No. 15/729,485.
USPTO; Non-Final Office Action dated Jun. 26, 2018 in U.S. Appl. No. 15/796,593.
USPTO; Notice of Allowance dated Jun. 13, 2018 in U.S. Appl. No. 15/798,120.
USPTO; Non-Final Office Action dated Aug. 9, 2018 in U.S. Appl. No. 15/798,201.
USPTO; Non-Final Office Action dated Jul. 2, 2018 in U.S. Appl. No. 15/815,483.
USPTO; Requirement for Restriction dated Mar. 21, 2018 in U.S. Appl. No. 15/863,340.
USPTO; Non-Final Office Action dated Jul. 23, 2018 in U.S. Appl. No. 15/863,340.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Notice of Allowance dated Dec. 19, 2013 in U.S. Appl. No. 29/448,094.
USPTO; Requirement for Restriction dated Dec. 1, 2014 in U.S. Appl. No. 29/481,312.
USPTO; Requirement for Restriction dated Dec. 4, 2014 in U.S. Appl. No. 29/481,315.
USPTO; Notice of Allowance dated Jun. 26, 2018 in U.S. Appl. No. 29/604,288.
Chinese Patent Office; Office Action dated Aug. 1, 2013 in Application No. 201080015699.9.

(56) References Cited

OTHER PUBLICATIONS

Chinese Patent Office; Office Action dated Jan. 21, 2014 in Application No. 201080015699.9.
Chinese Patent Office; Office Action dated Jul. 24, 2014 in Application No. 201080015699.9.
Chinese Patent Office; Office Action dated Dec. 10, 2013 in Application No. 201080020267.7.
Chinese Patent Office; Office Action dated Jan. 21, 2013 in Application No. 201080020268.1.
Chinese Patent Office; Office Action dated Sep. 26, 2013 in Application No. 201080020268.1.
Chinese Patent Office; Office Action dated Apr. 3, 2014 in Application No. 201080020268.1.
Chinese Patent Office; Office Action dated Sep. 23, 2014 in Application No. 201080020268.1.
Chinese Patent Office; Office Action dated Apr. 7, 2015 in Application No. 201080020268.1.
Chinese Patent Office; Office Action dated Dec. 4, 2015 in Application No. 201210201995.9.
Chinese Patent Office; Office Action dated Jul. 14, 2016 in Application No. 201210201995.9.
Chinese Patent Office; Office Action dated Jan. 20, 2017 in Application No. 201210201995.9.
Chinese Patent Office; Office Action dated Dec. 24, 2015 in Application No. 201280057466.4.
Chinese Patent Office; Office Action dated Dec. 4, 2015 in Application No. 201280057542.1.
Chinese Patent Office; Office Action dated May 16, 2016 in Application No. 201280057542.1.
Chinese Patent Office; Office Action dated Sep. 9, 2016 in Application No. 201280057542.1.
Chinese Patent Office; Office Action dated Dec. 5, 2016 in Application No. 201310412808.6.
Chinese Patent Office; Office Action dated Feb. 5, 2018 in Application No. 201410331047.6.
European Patent Office; Supplementary European Search Report and Opinion dated Nov. 9, 2012 in Application No. 08798519.8.
European Patent Office; Office Action dated Jul. 18, 2016 in Application No. 08798519.8.
European Patent Office; Extended European Search Report dated Dec. 9, 2016 in Application No. 9767208.3.
European Patent Office; Supplementary European Search Report and Opinion dated Jan. 5, 2017 in Application No. 09836647.9.
European Patent Office; Office Action dated Feb. 28, 2018 in Application No. 09836647.9.
Japanese Patent Office; Office Action dated Dec. 20, 2011 in Application No. 2010-522075.
Japanese Patent Office; Office Action dated Apr. 11, 2012 in Application No. 2010-522075.
Japanese Patent Office; Office Action dated May 31, 2012 in Application No. 2011-514650.
Japanese Patent Office; Office Action dated Sep. 11, 2012 in Application No. 2011-514650.
Japanese Patent Office; Office Action dated Dec. 25, 2013 in Application No. 2012-504786.
Japanese Patent Office; Office Action dated Mar. 11, 2013 in Application No. 2012-509857.
Korean Patent Office; Final Office Action dated Jun. 29, 2016 in Application No. 10-2010-0028336.
Korean Patent Office; Office Action dated Mar. 3, 2016 in Application No. 10-2010-0067768.
Korean Patent Office; Office Action dated Aug. 1, 2016 in Application No. 10-2010-0067768.
Korean Patent Office; Office Action dated May 2, 2016 in Application No. 10-2010-0082446.
Korean Patent Office; Office Action dated Sep. 19, 2016 in Application No. 10-2010-0082446.
Korean Patent Office; Office Action dated Nov. 24, 2017 in Application No. 10-20110036449.
Korean Patent Office; Office Action dated May 23, 2017 in Application No. 10-20110036449.
Korean Patent Office; Office Action dated Dec. 11, 2015 in Application No. 10-20117023416.
Korean Patent Office; Office Action dated Mar. 13, 2016 in Application No. 10-20117023416.
Korean Patent Office; Office Action dated Sep. 4, 2017 in Application No. 10-2011-0087600.
Korean Patent Office; Office Action dated Oct. 23, 2017 in Application No. 10-2011-0142924.
Korean Patent Office; Office Action dated Oct. 30, 2017 in Application No. 10-2012-0041878.
Korean Patent Office; Office Action dated Mar. 21, 2018 in Application No. 10-20120042518.
Korean Patent Office; Office Action dated Mar. 21, 2018 in Application No. 10-2012-0064526.
Korean Patent Office; Office Action dated Mar. 30, 2018 in Application No. 10-2012-0076564.
Korean Patent Office; Office Action dated Apr. 30, 2018 in Application No. 10-2012-0103114.
Korean Patent Office; Office Action dated Oct. 24, 2016 in Application No. 10-20127004062.
Korean Patent Office; Office Action dated Jul. 24, 2017 in Application No. 10-20127004062.
Korean Patent Office; Office Action dated Sep. 28, 2017 in Application No. 10-20147017112.
Korean Patent Office; Office Action dated Nov. 9, 2016 in Application No. 10-20167023913.
Korean Patent Office; Office Action dated Sep. 15, 2017 in Application No. 30-2017-0001320.
Korean Patent Office; Office Action dated Jul. 11, 2018 in Application No. 30-2018-006016.
Taiwanese Patent Office; Office Action dated Aug. 30, 2013 in Application No. 97132391.
Taiwanese Patent Office; Office Action dated Dec. 20, 2013 in Application No. 98117513.
Taiwanese Patent Office; Office Action dated Aug. 27, 2014 in Application No. 99114329.
Taiwanese Patent Office; Office Action dated Dec. 26, 2014 in Application No. 99114330.
Taiwanese Patent Office; Office Action dated Aug. 14, 2014 in Application No. 99114331.
Taiwanese Patent Office; Office Action received in Application No. 100113130.
Taiwanese Patent Office; Office Action dated Aug. 1, 2016 in Application No. 101124745.
Taiwanese Patent Office; Office Action received in Application No. 102113028.
Taiwanese Patent Office; Office Action received in Application No. 102115605.
Taiwanese Patent Office; Office Action dated Feb. 24, 2017 in Application No. 102115605.
Taiwanese Patent Office; Office Action received in Application No. 102125191.
Taiwanese Patent Office; Office Action dated Dec. 6, 2016 in Application No. 102126071.
Taiwanese Patent Office; Office Action dated May 17, 2018 in Application No. 102126071.
Taiwanese Patent Office; Office Action dated Feb. 10, 2017 in Application No. 102127065.
Taiwanese Patent Office; Office Action dated Mar. 11, 2016 in Application No. 102129262.
Taiwanese Patent Office; Office Action dated Dec. 29, 2016 in Application No. 102129397.
Taiwanese Patent Office; Office Action dated Nov. 4, 2016 in Application No. 102131839.
Taiwanese Patent Office; Office Action dated Nov. 11, 2016 in Application No. 102132952.
Taiwanese Patent Office; Office Action dated Dec. 2, 2016 in Application No. 102136496.
Taiwanese Patent Office; Office Action dated Jan. 10, 2018 in Application No. 102136496.

(56) References Cited

OTHER PUBLICATIONS

Taiwanese Patent Office; Office Action dated Jul. 17, 2017 in Application No. 103101400.
Taiwanese Patent Office; Office Action dated Feb. 23, 2017 in Application No. 103102563.
Taiwanese Patent Office; Office Action dated Mar. 3, 2017 in Application No. 103105251.
Taiwanese Patent Office; Office Action received in Application No. 103106021.
Taiwanese Patent Office; Office Action dated Oct. 31, 2017 in Application No. 103106022.
Taiwanese Patent Office; Office Action dated Jul. 5, 2017 in Application No. 103117477.
Taiwanese Patent Office; Office Action dated Nov. 22, 2017 in Application No. 103117478.
Taiwanese Patent Office; Office Action dated May 19, 2017 in Application No. 103120478.
Taiwanese Patent Office; Office Action dated Nov. 8, 2017 in Application No. 103124509.
Taiwanese Patent Office; Office Action dated Nov. 20, 2017 in Application No. 103127588.
Taiwanese Patent Office; Office Action dated Sep. 19, 2017 in Application No. 103127734.
Taiwanese Patent Office; Office Action dated Nov. 22, 2017 in Application No. 103134537.
Taiwanese Patent Office; Office Action dated Aug. 24, 2017 in Application No. 103136251.
Taiwanese Patent Office; Office Action dated Feb. 26, 2018 in Application No. 103138510.
Taiwanese Patent Office; Office Action dated May 21, 2018 in Application No. 103139014.
Taiwanese Patent Office; Office Action dated Jun. 22, 2018 in Application No. 104105533.
Taiwanese Patent Office; Office Action dated Jun. 13, 2018 in Application No. 104111910.
Taiwanese Patent Office; Office Action received in Application No. 106117181.
Guan et al., "Voltage gated ion and molecule transport in engineered nanochannels: theory, fabrication and applications," Nanotechnology 25 (2014) 122001.
Hudis, "Surface Crosslinking of Polyethylene Using a Hydrogen Glow Discharge," J. Appl. Polym. Sci., 16 (1972) 2397.
Mix et al., "Characterization of plasma-polymerized allyl alcohol polymers and copolymers with styrene," Adhes. Sci. Technol., 21 (2007), S. 487-507.
SIPO; First Office Action dated Dec. 20, 2018 in Application No. 201710738549.4.
TIPO; First Office Action dated Dec. 26, 2018 in Application No. 106127690.

\* cited by examiner

EXHAUST APPARATUS AND SUBSTRATE PROCESSING APPARATUS HAVING AN EXHAUST LINE WITH A FIRST RING HAVING AT LEAST ONE HOLE ON A LATERAL SIDE THEREOF PLACED IN THE EXHAUST LINE

CROSS-REFERENCE TO RELATED APPLICATION

This application claims the benefit of Korean Patent Application No. 10-2016-0108380, filed on Aug. 25, 2016, in the Korean Intellectual Property Office, the disclosure of which is incorporated herein in its entirety by reference.

BACKGROUND

1. Field

One or more embodiments relate to an exhaust apparatus, a substrate processing apparatus using the exhaust apparatus, and a thin film fabricating method using the exhaust apparatus, and more particularly, to an exhaust apparatus configured to selectively discharge gases, a substrate processing apparatus using the exhaust apparatus, and a thin film fabricating method using the exhaust apparatus.

2. Description of the Related Art

Along with the development of semiconductor technology, semiconductor substrate processing processes such as a deposition process or an etching process have become more intricate, and various chemical materials have been used as source materials. Thus, substrate processing apparatuses having various structures have been developed to process various source materials.

If different chemical materials having high reactivity are used as source materials, the operation of equipment may be affected by reaction byproducts. For example, reaction byproducts may remain in solid form in; reactors or exhaust lines. Such remaining solid matter may decrease the efficiency of exhaust systems and may cause internal components such as valves or pressure gauges to malfunction. In addition, such solid matter may remain in exhaust pumps or scrubbers configured to collect harmful chemicals before the harmful chemicals are discharged to the air. In this case, the operation of substrate processing apparatuses may stop, or the operation or productivity of substrate processing apparatuses may be negatively affected.

SUMMARY

One or more embodiments include an exhaust apparatus configured to prevent the formation of reaction byproducts by selectively discharging gases, a substrate processing apparatus using the exhaust apparatus, and a thin film fabricating method using the exhaust apparatus.

Additional aspects will be set forth in part in the description which follows and, in part, will be apparent from the description, or may be learned by practice of the presented embodiments.

According to one or more embodiments, an exhaust apparatus (or a substrate processing apparatus) includes: a first region; a second region connected to the first region; a third region connected to the first region; and a first gas line connected to the second region, wherein when gas is supplied to the first gas line, the first region does not communicate with the second region but communicates with the third region.

The exhaust apparatus (or the substrate processing apparatus) may further include a second gas line connected to the third region, wherein when gas is supplied to the second gas line, the first region may not communicate with the third region but may communicate with the second region.

The first gas line and the second gas line may be connected to each other.

The exhaust apparatus (or the substrate processing apparatus) may further include a first gas supply ring placed in the second region, wherein the first gas supply ring may include at least one hole connected to the first gas line.

The exhaust apparatus (or the substrate processing apparatus) may further include a bypass line connected to the second region.

The exhaust apparatus (or the substrate processing apparatus) may further include a first gas supply ring placed in the second region, wherein the first gas supply ring may include: a first hole connected to the first gas line; and a second hole connected to the bypass line.

The first hole may be located between the second hole and the first region. When gas is supplied to the first gas line, gas from the first region may be discharged to the third region, and gas from the bypass line may be discharged to the second region.

Gas supplied through the first gas line may not react with gas supplied through the bypass line.

The first gas line may include a first opening/closing unit, the second gas line may include a second opening/closing unit, and the exhaust apparatus (or the substrate processing apparatus) may further include a controller configured to control the first and second opening/closing units.

The exhaust apparatus (or the substrate processing apparatus) may further include a gas analysis unit connected to at least one of the first region, the second region, and the third region, wherein the controller may communicate with the gas analysis unit and determine operation timing of the first and second opening/closing units.

According to one or more embodiments, an exhaust apparatus (or a substrate processing apparatus) includes: an upper plate; a body; at least one gas supply ring; a lower plate; a first sub-exhaust line; a second sub-exhaust line; and at least one purge gas supply path penetrating the body and connected to the gas supply ring.

At least one exhaust path branching off from the main exhaust line may be formed in the body, and the exhaust path may be connected with the first sub-exhaust line and the second sub-exhaust line.

The gas supply ring may be located between the exhaust path and the first sub-exhaust line or between the exhaust path and the second sub-exhaust line.

The exhaust apparatus (or the substrate processing apparatus) may further include at least one bypass gas supply path penetrating the body and connected to the gas supply ring.

The gas supply ring may include at least one gas hole in a lateral side thereof, wherein the at least one gas hole may include: an upper hole connected to the purge gas supply path; and a lower hole connected to the bypass gas supply path, wherein the exhaust apparatus (or the substrate processing apparatus) may further include a sealing measure between the upper hole and the lower hole.

Purge gas discharged to the exhaust path formed in the body through the purge gas supply path and the upper hole may form a gas curtain in the exhaust path.

Gas flowing to the exhaust path through the purge gas supply path and the upper hole of the gas supply ring may be an inert gas, and gas flowing to the exhaust path through the bypass gas supply path and the lower hole of the gas supply ring may be dichlorosilane (DCS, $SiH_2Cl_2$) gas or $NH_3$ gas.

The exhaust apparatus (or the substrate processing apparatus) may further include an anti-backflow device connected to the purge gas supply path.

According to one or more embodiments, a substrate processing apparatus includes: a gas supply unit; a reactor; an exhaust unit; and an exhaust pump unit, wherein the gas supply unit includes: at least one gas line through which gas is supplied to the reactor from the gas supply unit; a bypass line branching off from the gas line and connected to the exhaust unit; and a purge gas line connected from the gas supply unit to the exhaust unit.

The exhaust unit may include: a main exhaust line; an upper plate; a body; a gas supply ring; a lower plate; and at least one sub-exhaust line, wherein the main exhaust line may be connected to the reactor, and the sub-exhaust line may be connected to the exhaust pump unit.

The body may include at least one exhaust path formed in the body and branching off from the main exhaust line, and the exhaust path may be connected to the sub-exhaust line, wherein the gas supply ring may be located between the exhaust path and the sub-exhaust line.

The substrate processing apparatus may further include: at least one purge gas supply path penetrating the upper plate and the body and connected to the exhaust path and the gas supply ring; and at least one bypass supply path penetrating the body and connected to exhaust path and the gas supply ring, wherein the purge gas supply path may be connected to the purge gas line, and the bypass gas supply path may be connected to the bypass line.

The gas supply ring may include at least one hole at a lateral side of the body, wherein the at least one hole may include: an upper hole through which a purge gas from the purge gas supply path passes; and a lower hole through which a bypass gas from the bypass gas supply path passes.

The lower hole may be located between the upper hole and the lower plate.

According to one or more embodiments, a thin film fabricating method includes: a first step of supplying a source gas; a second step of purging the source gas; a third step of supplying a reaction gas; and a fourth step of supplying plasma, wherein the source gas, the reaction gas, and the plasma are sequentially supplied, and a first purge gas is continuously supplied to a reaction space while the source gas, the reaction gas, and the plasma are supplied.

During the second step of purging the source gas, the source gas and the first purge gas may be discharged through a first path of an exhaust unit, and a second purge gas may be supplied to a second path of the exhaust unit.

During the second step of purging the source gas, the second purge gas may form a gas curtain in the second path.

When one of the source gas and the reaction gas is supplied to a reactor, the other gas may be bypassed to the exhaust unit.

A path to which the bypassed gas is discharged may be different from a path to which gas discharged from the reactor is discharged.

During the first step of supplying the source gas, the source gas and the first purge gas may be supplied to the reaction space, and the reaction gas may be supplied to the second path of the exhaust unit.

During the second step of purging the source gas, the first purge gas may be supplied to the reaction space, the source gas may be supplied to the first path of the exhaust unit, and the reaction gas may be supplied to the second path of the exhaust unit.

A first flow rate of the first purge gas supplied during the first step of supplying the source gas may be lower than a second flow rate of the second purge gas supplied during the second step of purging the source gas.

During the third step of supplying the reaction gas and the fourth step of supplying the plasma, the reaction gas and the first purge gas may be supplied to the reaction space, and the source gas may be supplied to the first path of the exhaust unit.

During the third step of supplying the reaction gas and the fourth step of supplying the plasma, the second purge gas may be supplied to the first path of the exhaust unit.

According to one or more embodiments, a thin film fabricating method includes: discharging a first gas from a first region to a second region; and discharging a second gas from the first region to a third region, wherein during the discharging of the first gas, a third gas is supplied to the third region to form a gas curtain including the third gas in the third region, and during the discharging of the second gas, the third gas is supplied to the second region to form a gas curtain including the third gas in the second region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
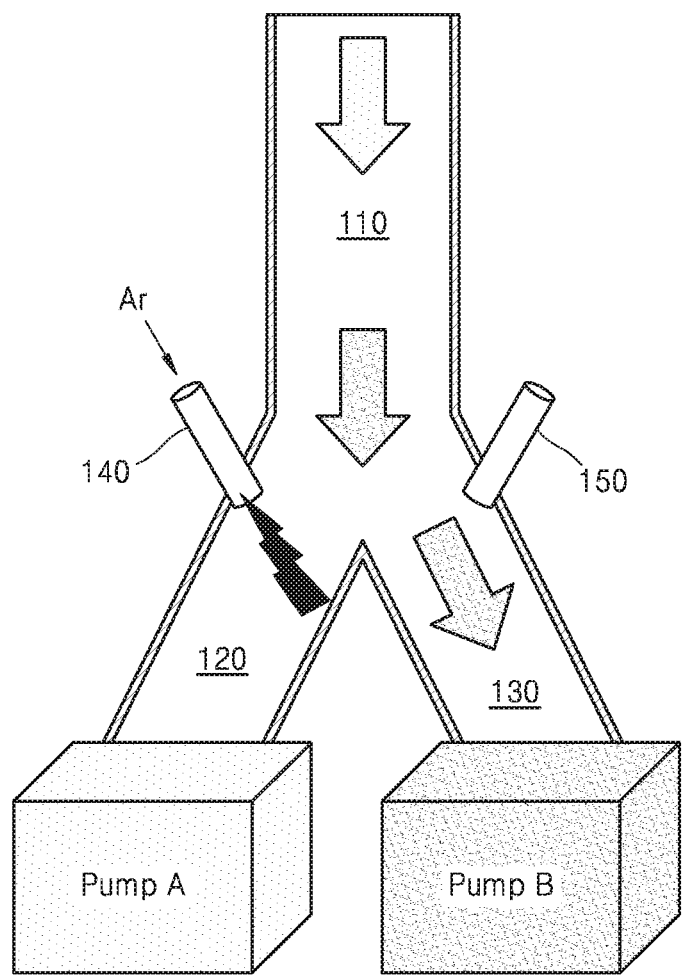
FIGS. 1 and 2 are schematic views illustrating an exhaust apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

Embodiments will now be described with reference to the accompanying drawings.

The inventive concept may, however, be embodied in many different forms and should not be construed as being limited to the embodiments set forth herein; rather, these embodiments are provided to give a clear understanding of the inventive concept to those of ordinary skill in the art. That is, the embodiments are provided so that this disclosure will be thorough and complete, and will fully convey the inventive concept to those of ordinary skill in the art.

In the following description, terms are used only for explaining specific embodiments while not limiting the inventive concept. The terms of a singular form may include plural forms unless referred to the contrary. The meaning of "comprise" and/or "comprising" specifies a shape, a fixed number, a step, a process, a member, an element, and/or a combination thereof but does not exclude other shapes, fixed numbers, steps, processes, members, elements, and/or combinations thereof. As used herein, the term "and/or" includes any and all combinations of one or more of the associated listed items.

It will be understood that, although the terms first, second, etc. may be used herein to describe various members, regions, and/or elements, these members, regions, and/or elements should not be limited by these terms. These terms are not used to denote a particular order, a positional relationship, or ratings of members, regions, or elements, but are only used to distinguish one member, region, or element from another member, region, or element. Thus, a first member, region, or element discussed below could be termed a second member, region, or element without departing from the teachings of the inventive concept.

Hereinafter, embodiments will be described with reference to the accompanying drawing. Shapes illustrated in the drawings may be varied according to various factors such as manufacturing methods and/or tolerances. That is, the embodiments are not limited to particular shapes illustrated in the drawings. Factors such as shape changes in manufacturing processes should be considered.

Figure 2:
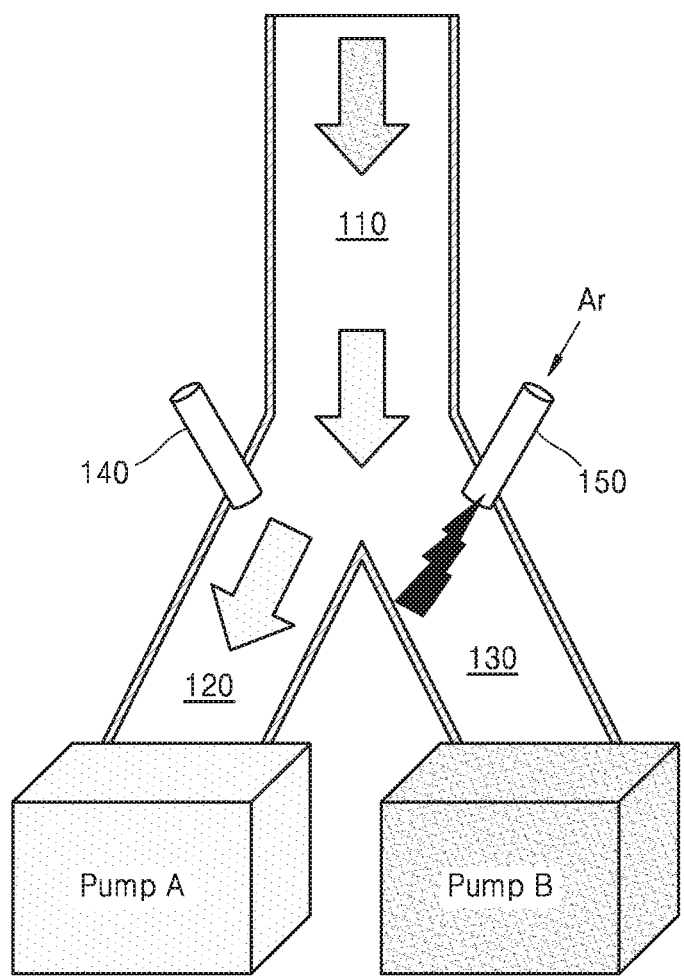

FIGS. 1 and 2 are schematic views illustrating an exhaust apparatus according to an embodiment.

Referring to FIG. 1, the exhaust apparatus may include a first region 110, a second region 120, a third region 130, a first gas line 140, and a second gas line 150.

The first region 110, the second region 120, and the third region 130 may be connected to each other and may extend in different directions. For example, the first region 110 may be a region of an exhaust path and may be connected to a main exhaust line. The second region 120 and the third region 130 may be other regions of the exhaust path and may be respectively connected to sub-exhaust lines branching off from the main exhaust line.

The first gas line 140 may be connected to the second region 120 and may have a function of determining whether the first region 110 and the second region 120 communicate with each other. Herein, the term or expression "communication" or "communicate with" may be used to indicate the possibility of exchange of flow of gas. For example, when the first region 110 communicates with the second region 120, gas may flow from the first region 110 to the second region 120 and from the second region 120 to the first region 110.

The second gas line 150 may be connected to the third region 130 and may have a function of determining whether the first region 110 and the second region 130 communicate with each other. For example, if gas is supplied to the first gas line 140, the first region 110 may not communicate with the second region 120 but may communicate with the third region 130 (refer to FIG. 1). In addition, if gas is supplied to the second gas line 150, the first region 110 may not communicate with the third region 130 but may communicate with the second region 120 (refer to FIG. 2).

In the exhaust apparatus, many kinds of gases may be supplied to the first region 110. Such gases may be selectively discharged to the second region 120 or the third region 130. For example, when gas is supplied to the first gas line 140, since the first region 110 communicates with the third region 130, gas (for example, a first gas) of the first region 110 may be discharged to the third region 130. However, when gas is supplied to the second gas line 150, since the first region 110 communicates with the second region 120, gas (for example, a second gas) of the first region 110 may be discharged to the second region 120.

The current embodiment relates to an exhaust line structure including a plurality of exhaust lines. In the current embodiment, gas lines are used to individually discharge at least two source gases. Such a gas line supplies gas having low reactivity (for example, an inert gas such as argon (Ar)) to an exhaust line to form a gas curtain in the exhaust line. Then, the exhaust line is substantially closed, and thus a particular gas may be selectively discharged.

Referring to FIG. 1, the first region 110 communicates with the third region 130, and thus a first gas is discharged from the first region 110 to the third region 130 by a pump B. Gas supplied to the second region 120 through the first gas line 140 is discharged from the second region 120 by a pump A. In other words, a gas having low reactivity with the first gas is supplied to the second region 120, and thus a gas curtain including the gas is formed in the second region 120.

Referring to FIG. 2, the first region 110 communicates with the second region 120, and thus a second gas is discharged from the first region 110 to the second region 120 by the pump A. Gas supplied to the third region 130 through the second gas line 150 is discharged from the third region 130 by the pump B. In other words, a gas having low reactivity with the second gas is supplied to the third region 130, and thus a gas curtain including the gas is formed in the third region 130.

As described above, the first region 110 may be adjacent to the main exhaust line, and the second region 120 and the third region 130 may respectively be adjacent to a first sub-exhaust line and a second sub-exhaust line. Therefore, gases supplied through the first gas line 140 and the second gas line 150 may respectively form gas curtains in entrances of the first and second sub-exhaust lines, and thus it may be possible to selectively discharge gases. In some embodiments, the flow rates of gases supplied through the first gas line 140 and/or the second gas line 150 may be maintained to be substantially equal to the flow rate of gas flowing out from a reactor.

As described above, the current embodiment provides a gas-based opening/closing structure that enables fast switching compared to a mechanical opening/closing structure. For example, fast switching between gases may be required in an atomic layer deposition process. However, if a mechanical opening/closing structure (for example, a flapper valve) is used in such an atomic layer deposition process, it may be difficult to control the atomic layer deposition process according to the required short gas exchange intervals because of limitations in mechanical operations. In addition, mechanical opening/closing structures are likely to break down or malfunction because of frequent physical operations.

However, the embodiment provides an opening/closing structure using a gas curtain instead of using a mechanical structure, thereby guaranteeing high speed operations. In addition, problems such as mechanical abrasion may not occur in the gas-based opening/closing structure of the embodiment. Thus, the gas-based opening/closing structure may have an infinite lifespan, and the durability of the exhaust apparatus having the gas-based opening/closing structure may be improved. Materials remaining after chemical reactions may accumulate on such mechanical opening/closing structures. However, such remaining materials may not accumulate on the gas-based opening/closing structure of the embodiment, and thus problems relating to such remaining materials may not occur. In addition, the gas-based opening/closing structure does not require an additional structure in exhaust lines, and thus a space for maintenance/repair may easily be ensured in the exhaust lines. That is, improvements may be made in terms of maintenance/repair.

The embodiment may have positive technical effects (for example, allowing rapid gas exchange and preventing inefficient operations of equipment caused by reaction byproducts) on atomic layer deposition processes such as a silicon nitride atomic layer deposition process in which dichlorosilane (DCS: $SiH_2Cl_2$) and $NH_3$ are used as source materials. This will be described hereinafter.

Figure 3:
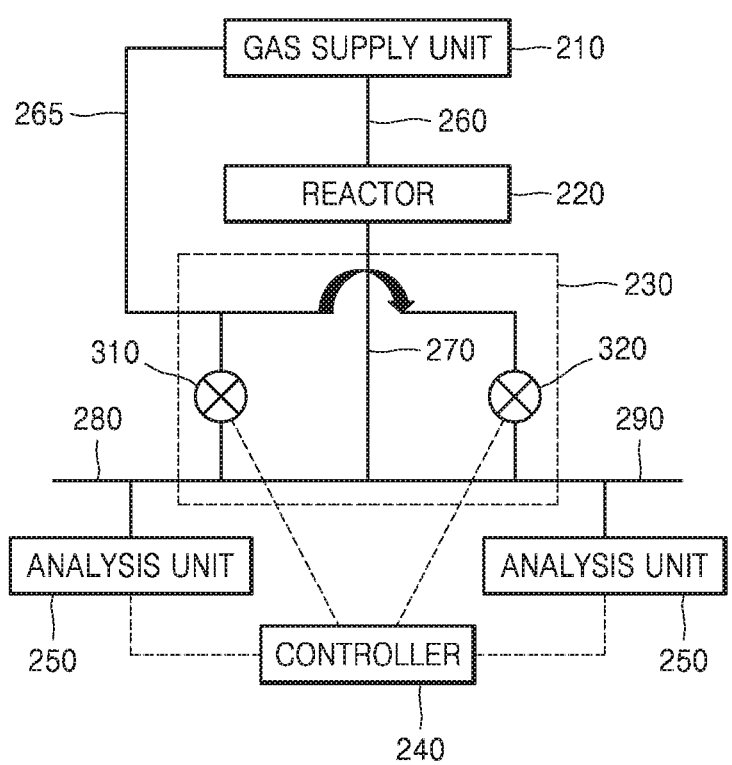
FIG. 3 is a schematic view illustrating a substrate processing apparatus according to an embodiment.

FIG. 3 is a schematic view illustrating a substrate processing apparatus according to an embodiment. The substrate processing apparatus of the current embodiment may be configured using the exhaust apparatus of the previous embodiment. Thus, the same description as that presented in the previous embodiment will not be presented here.

Referring to FIG. 3, the substrate processing apparatus may include a gas supply unit 210, a reactor 220, an exhaust unit 230, a controller 240, and gas analysis units 250. The substrate processing apparatus may further include exhaust pumps (not shown) connected to the exhaust unit 230 (refer to FIGS. 1 and 2).

The gas supply unit 210 may supply at least two source gases and/or a first purge gas to the reactor 220 through at least one reaction gas line 260. The gas supply unit 210 may be connected to a showerhead configured to supply gas to a substrate in a vertical direction. In another embodiment, the gas supply unit 210 may be connected to a lateral-flow device configured to supply gas in a lateral direction. In another embodiment, the gas supply unit 210 may be connected to any device configured to supply gas to a reaction space.

A first gas line 140 and a second gas line 150 may be connected to each other, and the gas supply unit 210 may supply a second purge gas to the first gas line 140 and/or the second gas line 150 through a purge gas line 265. In addition, the substrate processing apparatus may further include a bypass line (not shown) branching off from the reaction gas line 260 and joining the exhaust unit 230. Therefore, source gases and/or a first purge gas may be directly supplied from the gas supply unit 210 to the exhaust unit 230 through the bypass line (refer to FIG. 6).

The exhaust unit 230 may selectively discharge gases received from the reactor 220. For example, as described above, the exhaust unit 230 may include a main exhaust line 270 connected to a first region, a first sub-exhaust line 280 connected to a second region, a second sub-exhaust line 290 connected to a third region, the first gas line 140, and the second gas line 150.

The first gas line 140 may include a first opening/closing unit 310. In addition, the second gas line 150 may include a second opening/closing unit 320. A purge gas may be supplied from the gas supply unit 210 to the first sub-exhaust line 280 and/or the second sub-exhaust line 290 depending on whether the first opening/closing unit 310 and/or the second opening/closing unit 320 are/is opened or closed.

The controller 240 may control the first opening/closing unit 310 and/or the second opening/closing unit 320. For example, the controller 240 may communicate with the analysis units 250 to determine operation timing of the first opening/closing unit 310 and/or the second opening/closing unit 320.

The analysis units 250 may analyze the compositions or properties of gases (for example, the components, temperatures, flow rates, pressures, or concentrations of gases). The analysis units 250 may be connected to at least one of the gas supply unit 210, the reaction gas line 260, the main exhaust line 270 connected to the first region, the first sub-exhaust line 280 connected to the second region, and the second sub-exhaust line 290 connected to the third region.

The controller 240 may communicate with the analysis units 250 to determine a time period during which gas reaches from the gas supply unit 210 to the first sub-exhaust line 280 (or the second sub-exhaust line 290). Then, the first opening/closing unit 310 or the second opening/closing unit 320 may be opened or closed based on the determined time period. Based on the operations of the first opening/closing unit 310 and the second opening/closing unit 320, a second purge gas may be supplied to the first sub-exhaust line 280 or the second sub-exhaust line 290 to form a gas curtain. As a result, source gases supplied from the gas supply unit 210 may be selectively discharged.

Figure 4:
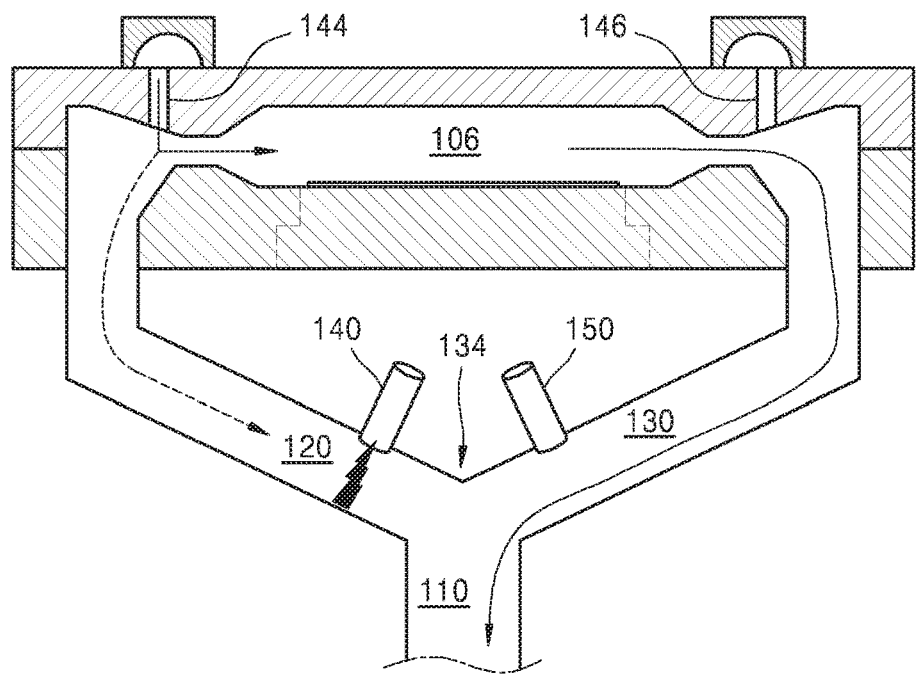
FIGS. 4 and 5 are schematic views illustrating a substrate processing apparatus including an exhaust apparatus according to another embodiment.
Figure 5:
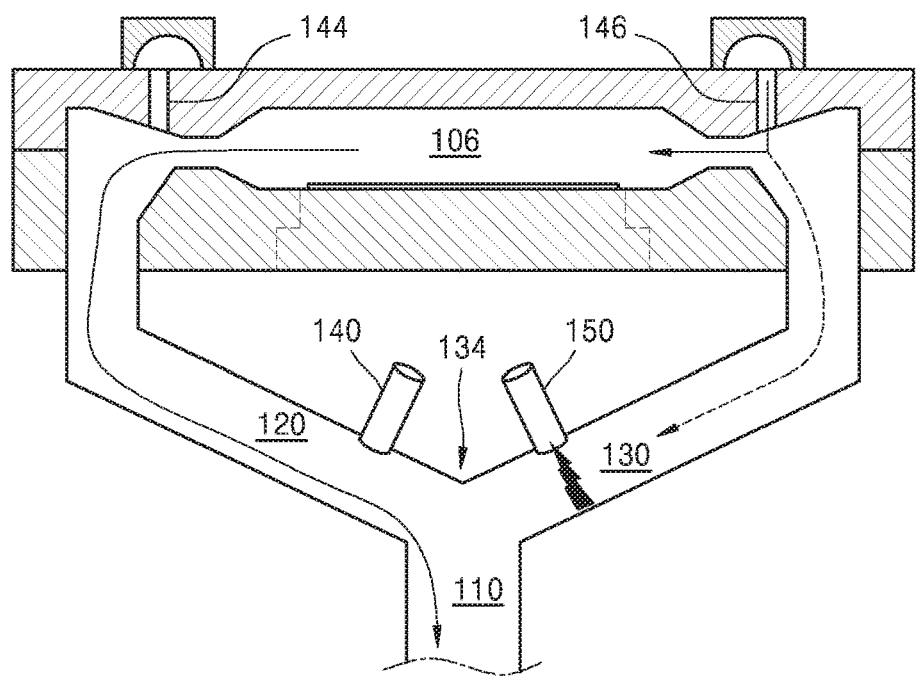

FIGS. 4 and 5 are schematic views illustrating a substrate processing apparatus including an exhaust apparatus according to another embodiment. The exhaust apparatus and the substrate processing apparatus of the current embodiment may be modifications of the exhaust apparatus and the substrate processing apparatus of the previous embodiments. Thus, the same description as that presented in the previous embodiments will not be presented here.

Referring to FIGS. 4 and 5, the substrate processing apparatus may include a first discharge part 144, a second discharge part 146, a reaction chamber 106, and the exhaust apparatus 134. The exhaust apparatus 134 may include a first region 110, a second region 120, a third region 130, a first gas line 140 connected to the second region 120, and a second gas line 150 connected to the third region 130.

The substrate processing apparatus may be a lateral-flow type substrate processing apparatus configured to supply gas in a lateral direction and discharge the gas through the exhaust apparatus 134. For example, a first gas (for example, a deposition or cleaning gas) may be supplied to the reaction chamber 106 through the first discharge part 144. In this case, the exhaust apparatus 134 may be operated such that gas flowing in the reaction chamber 106 may be discharged through the third region 130.

For example, the exhaust apparatus 134 may supply a low-reactivity gas (and the first gas) to the first gas line 140. In this case, the first region 110 does not communicate with the second region 120 owing to the low-reactivity gas but communicates with the third region 130. Therefore, the first gas supplied through the first discharge part 144 may be discharged through only the third region 130.

Referring to FIG. 5, a second gas may be supplied to the reaction chamber 106 through the second discharge part 146. In this case, the exhaust apparatus 134 may be operated such that gas flowing in the reaction chamber 106 may be discharged through the second region 120.

For example, the exhaust apparatus 134 may supply a low-reactivity gas (and the second gas) to the second gas line 150. In this case, the first region 110 does not communicate with the third region 130 owing to the low-reactivity gas but communicates with the second region 120. Therefore, the second gas supplied through the second discharge part 146 may be discharged through only the second region 120.

Figure 6:
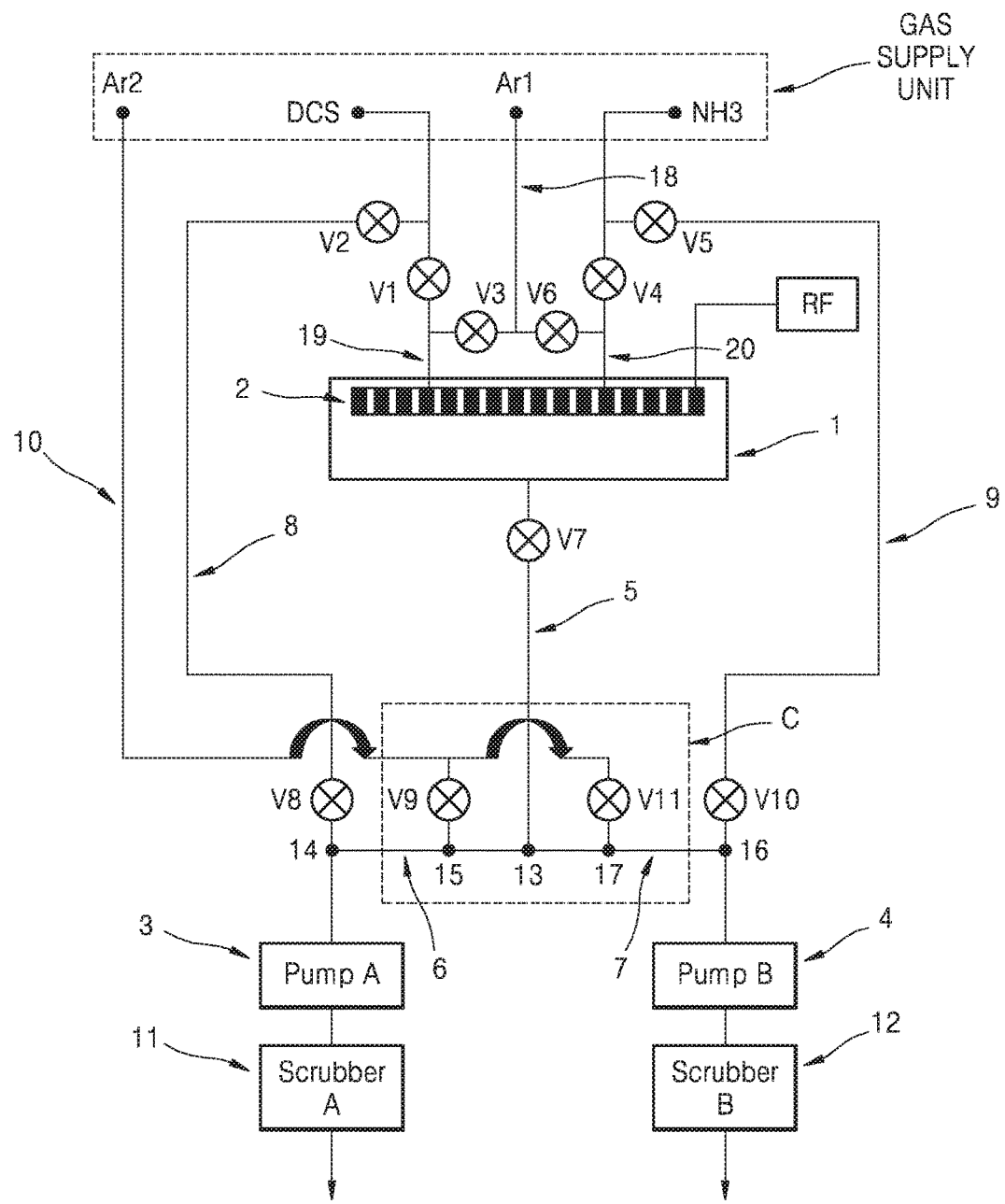
FIG. 6 is a schematic view illustrating a substrate processing apparatus including an exhaust apparatus according to another embodiment.

FIG. 6 is a schematic view illustrating a substrate processing apparatus including an exhaust apparatus C according to another embodiment. The exhaust apparatus C and the substrate processing apparatus of the current embodiment may be modifications of the exhaust apparatuses and the substrate processing apparatuses of the previous embodiments. Thus, the same description as that presented in the previous embodiments will not be presented here.

Referring to FIG. 6, like in the previous embodiments, the substrate processing apparatus may include a gas supply unit, a reactor 1, the exhaust apparatus C, a first pump 3, a first scrubber 11, a second pump 4, and a second scrubber 12. The substrate processing apparatus may be configured to supply gas to a substrate using a gas injection unit 2 in a direction perpendicular to the substrate.

For example, the substrate processing apparatus illustrated in FIG. 6 may be an atomic layer deposition apparatus configured to form a silicon nitride film. In the current embodiment, DCS (Dichlorosilane; $SiH_2Cl_2$) is used as a silicon source, and ammonia ($NH_3$) is used as a nitrogen source. The atomic layer deposition apparatus (substrate processing apparatus) of the current embodiment may include the reactor 1, the gas injection unit 2, the first pump (DCS exhaust pump) 3, the second pump ($NH_3$ exhaust pump) 4, a main exhaust line 5, a DCS sub-exhaust line 6, a $NH_3$ sub-exhaust line 7, a DCS bypass line 8, an $NH_3$ bypass line 9, a purge argon line 10, the first scrubber (DCS scrubber) 11, and the second scrubber ($NH_3$ scrubber) 12. In addition, the atomic layer deposition apparatus may further include valves v1 to v11 to control flows of gases in lines.

The reactor 1 may provide a space (for example, a closed space) in which a silicon nitride thin film is deposited on a substrate. To this end, the reactor 1 may be isolated from the outside of the reactor 1 using a sealing measure such as an O-ring. In general, the reactor 1 may be maintained at a pressure equal to or lower than atmospheric pressure. A substrate support or susceptor (not shown) may be placed in the reactor 1, and a gate valve (not shown) may be located at a lateral side of the reactor 1 to introduce and discharge substrates therethrough. The gate valve may be opened only when a substrate is introduced or discharged through the gate valve and may be maintained in a closed state during a process.

DCS and $NH_3$ supplied through a DCS line 19 and an $NH_3$ line 20, and process argon Ar1 supplied through a process argon line 18 may be uniformly supplied to a silicon substrate through the gas injection unit 2. For example, the gas injection unit 2 may be a showerhead. In some embodiments, the gas injection unit 2 may be connected to a radio frequency (RF) plasma generator to perform a plasma atomic layer deposition process. In other embodiments, the gas injection unit 2 may function as a plasma electrode.

Exhaust pumps may include the DCS exhaust pump 3 and the $NH_3$ exhaust pump 4. Source gases used in a process are toxic, corrosive, and inflammable and are thus collected using a scrubber before being discharged to the outside air. In the embodiment, scrubbers are connected to rear ends of the exhaust pumps such that gases discharged through the pumps after a process may be filtered by the scrubbers and may then be discharged to the outside air in a purified state. That is, as illustrated in FIG. 6, the DCS scrubber 11 and the $NH_3$ scrubber 12 may respectively be connected to the DCS exhaust pump 3 and the $NH_3$ exhaust pump 4. The DCS exhaust pump 3 and the DCS scrubber 11 may process a DCS source gas, and the $NH_3$ exhaust pump 4 and the $NH_3$ scrubber 12 may process $NH_3$ gas.

After passing through the reactor 1, source/reaction gases may be discharged through the exhaust apparatus C. The exhaust apparatus C may include the main exhaust line 5 and the two sub-exhaust lines 6 and 7. The main exhaust line 5 may branch into the two sub-exhaust lines 6 and 7 at a branching point 13. The two sub-exhaust lines 6 and 7 are a DCS sub-exhaust line and an $NH_3$ sub-exhaust line, respectively.

The substrate processing apparatus may further include bypass lines. For example, the substrate processing apparatus being configured as an atomic layer deposition apparatus in the current embodiment may include the DCS bypass line 8 and the $NH_3$ bypass line 9. In this case, DCS and $NH_3$ may be alternately supplied to the reactor 1 during an atomic layer deposition process. When DCS is supplied to the reactor 1, $NH_3$ may be discharged to the $NH_3$ exhaust pump 4 through the $NH_3$ bypass line 9, and when $NH_3$ is supplied to the reactor 1, DCS may be discharged to the DCS exhaust pump 3 through the DCS bypass line 8. That is, a continuous flow may be maintained while source/reaction gases are alternately supplied to the reactor 1 and the bypass lines 8 and 9 in a switching manner, and thus the inside pressure of gas lines and the reactor 1 may be constantly maintained, thereby ensuring process stability.

In the embodiment illustrated in FIG. 6, the substrate processing apparatus may further include the purge argon line 10. The purge argon line 10 may be connected to the DCS sub-exhaust line 6 and the $NH_3$ sub-exhaust line 7, and thus purge argon Ar2 may be supplied to the DCS sub-exhaust line 6 and the $NH_3$ sub-exhaust line 7 through the purge argon line 10.

For example, the purge argon line 10 may be connected to the DCS sub-exhaust line 6 at a front end 15 of a connection part 14 between the DCS bypass line 8 and the DCS sub-exhaust line 6 and may be connected to the $NH_3$ sub-exhaust line 7 at a front end 17 of a connection part 16 between the $NH_3$ bypass line 9 and the $NH_3$ sub-exhaust line 7. In some embodiments, check valves may be respectively provided in the connection parts and ends 14, 15, 16, and 17 to prevent gases from flowing backward from the sub-exhaust lines 6 and 7 to the bypass lines 8 and 9 or the purge argon line 10.

Figure 7:
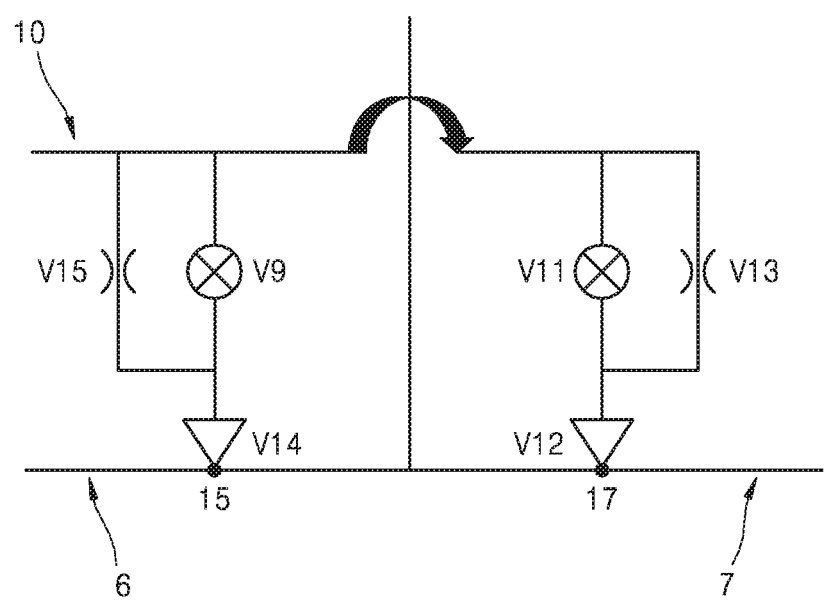
FIG. 7 is a schematic view illustrating an exhaust apparatus according to another embodiment.

FIG. 7 is a schematic view illustrating an exhaust apparatus according to another embodiment. The exhaust apparatus of the current embodiment may be a modification of the exhaust apparatuses of the previous embodiments. Thus, the same description as that presented in the previous embodiments will not be presented here.

Referring to FIG. 7, a purge argon line 10 may branch into a DCS sub-exhaust line 6 and an $NH_3$ sub-exhaust line 7. Devices allowing gas to flow only in one direction such as check valves v14 and v12 may be provided in connection parts 15 and 17 between the purge argon line 10 and the sub-exhaust lines 6 and 7.

In some embodiments, as illustrated in FIG. 7, orifices v15 and v13 may be further provided between the purge argon line 10 and the sub-exhaust lines 6 and 7. Each of the orifices v15 and v13 may be configured to maintain the flow rate of gas at a constant level. Therefore, owing to the orifices v15 and v13, purge argon may always flow in the purge argon line 10 and the sub-exhaust lines 6 and 7 regardless of whether a DCS purge argon valve v9 and an $NH_3$ purge argon valve v11 are closed or opened.

For example, when the DCS purge argon valve v9 is in a closed state, a certain amount of argon gas may be filled in a gas exhaust line between the check valve v14 and the DCS purge argon valve v9 so as to prevent a backflow of gas in the DCS sub-exhaust line 6. The flow rate of purge argon at the orifices v15 and v13 may be set to be about 10% to about 15% of the flow rate of purge argon supplied to the purge argon line 10.

FIGS. 8 to 13 are schematic views illustrating an exhaust apparatus according to another embodiment. The exhaust apparatus of the current embodiment may be a modification of the exhaust apparatuses of the previous embodiments. Thus, the same description as that presented in the previous embodiments will not be presented here.

Figure 8:
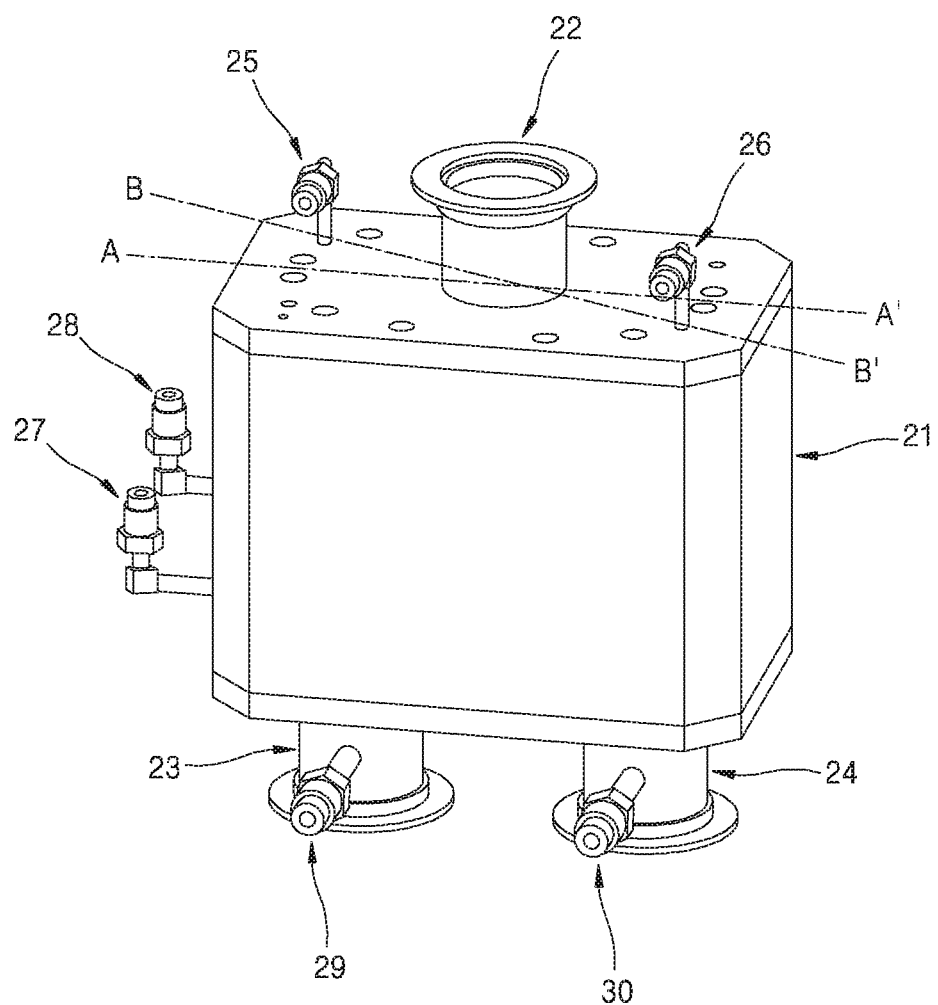
FIGS. 8 to 13 are schematic views illustrating an exhaust apparatus according to another embodiment.
Figure 9:
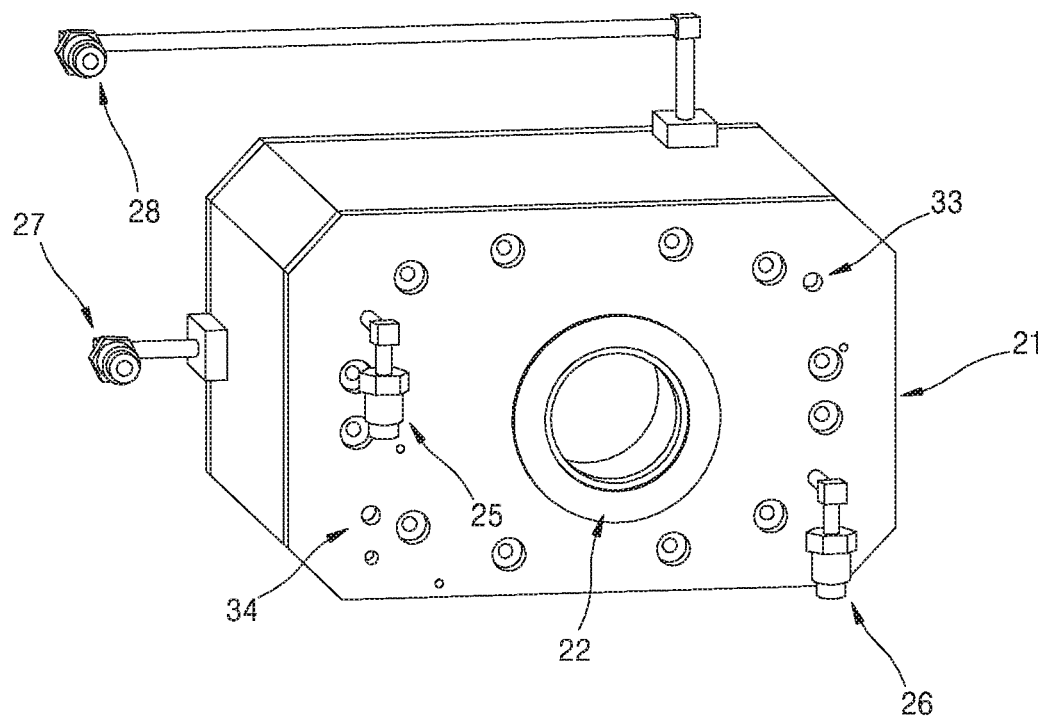

Referring to FIGS. 8 and 9, the exhaust apparatus may include an exhaust unit body 21, a main exhaust line 22, a DCS sub-exhaust line 23, an $NH_3$ sub-exhaust line 24, a DCS purge argon line 25, an $NH_3$ purge argon line 26, a DCS bypass line 27, an $NH_3$ bypass line 28, connection parts 29 and 30, and cartridge heater holes 33 and 34.

The main exhaust line 22, the DCS sub-exhaust line 23, the $NH_3$ sub-exhaust line 24, the DCS bypass line 27, and the $NH_3$ bypass line 28 of the exhaust apparatus illustrated in FIGS. 8 and 9 may respectively correspond to the main exhaust line 5, the DCS sub-exhaust line 6, the $NH_3$ sub-exhaust line 7, the DCS bypass line 8, and the $NH_3$ bypass line 9 of the substrate processing apparatus illustrated in FIG. 6.

In addition, the DCS purge argon line 25 and the $NH_3$ purge argon line 26 of the exhaust apparatus illustrating in FIG. 8 may branch off from the purge argon line 10 illustrated in FIG. 6. Therefore, argon gas may be supplied to the DCS purge argon line 25 and the $NH_3$ purge argon line 26 in an alternating manner by switching operations of the valves v9 and v11 (refer to FIG. 6). Similarly, DCS gas and $NH_3$ gas may be respectively supplied to the DCS bypass line 27 and the $NH_3$ bypass line 28 in an alternating manner by switching operations of valves v2 and v5 (refer to FIG. 6).

The connection parts 29 and 30 of the exhaust apparatus may be connected to gas analysis units (not shown). For example, the connection parts 29 and 30 may be connected to pressure gauges, and thus the pressures of the DCS sub-exhaust line 23 and the $NH_3$ sub-exhaust line 24 may be measured. In some embodiments, the connection parts 29 and 30 may be connected to exhaust gas component analyzers, and thus the compositions of exhaust gases may be analyzed to determine the amounts and compositions of remaining gases and gas supply conditions such as flow rates and supply times.

In addition, as described above, the DCS purge argon line 25, the $NH_3$ purge argon line 26, the DCS bypass line 27, and the $NH_3$ bypass line 28 may include anti-backflow devices. The anti-backflow devices may be check valves and/or orifices allowing only unidirectional flows.

FIG. 9 is a top view of the exhaust apparatus depicted in FIG. 8. The DCS bypass line 27 may be connected to the DCS sub-exhaust line 23 at a lateral side of the exhaust unit body 21, and the $NH_3$ bypass line 28 may be connected to the $NH_3$ sub-exhaust line 24 at a rear side of the exhaust unit body 21.

In some embodiments, cartridge heaters may be inserted into the cartridge heater holes 33 and 34 to heat the exhaust unit body 21. If the exhaust unit body 21 is heated, reaction byproducts may not be deposited on internal exhaust lines or may not float in the exhaust unit body 21.

Figure 10:
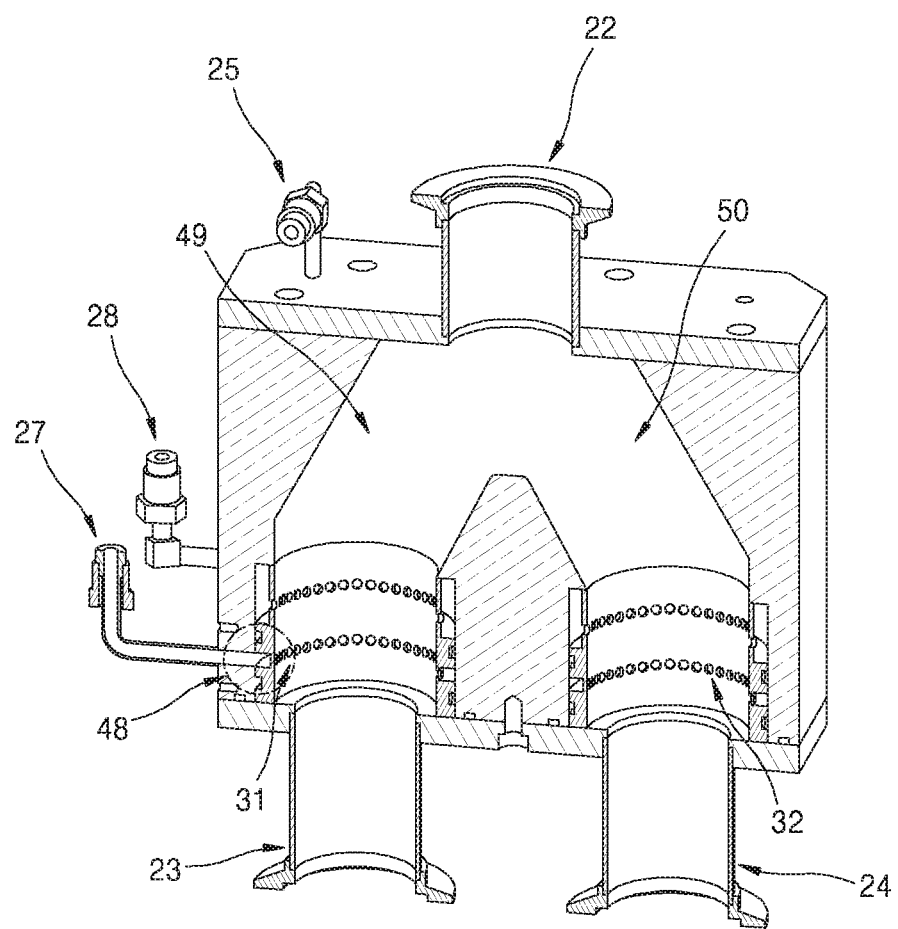
Figure 11:
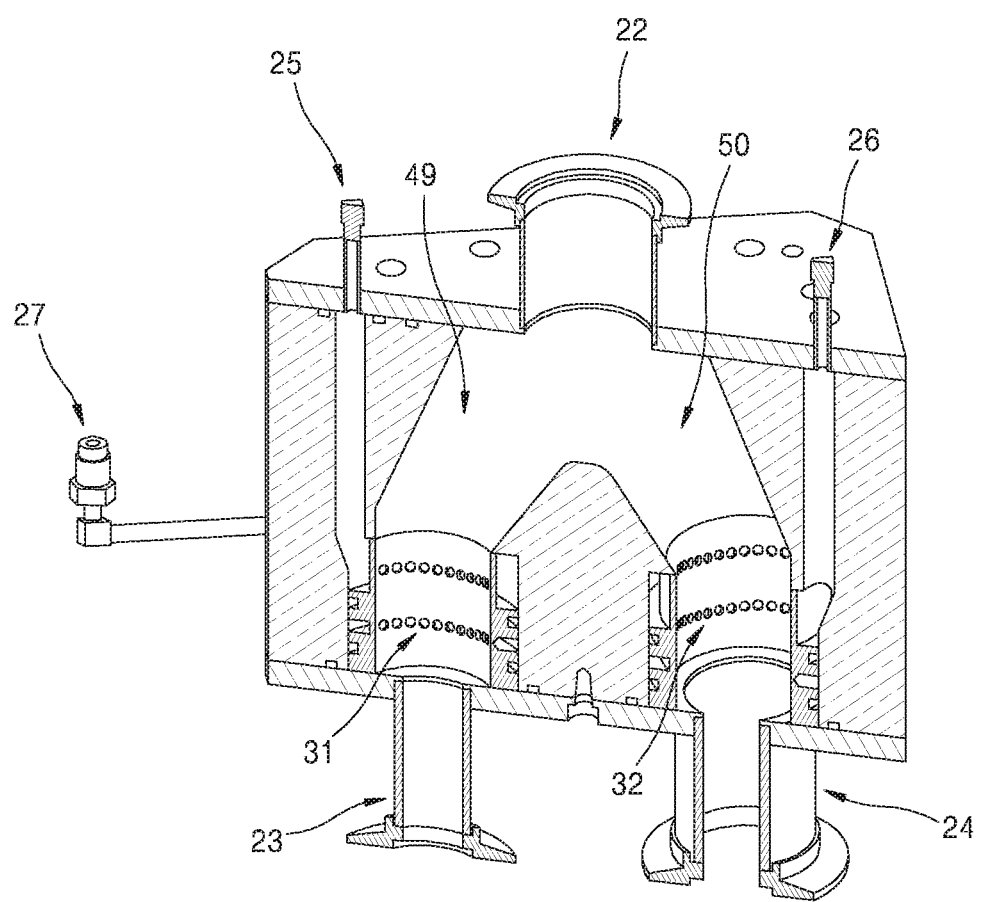

FIGS. 10 and 11 are cross-sectional views taken along lines A-A' and B-B' of FIG. 8. Referring to the cross-sectional view of an exhaust unit in FIG. 10, a DCS exhaust path 49 and an $NH_3$ exhaust path 50 branching off from the main exhaust line 22 may be formed inside the exhaust unit body 21, and the DCS exhaust path 49 and the $NH_3$ exhaust path 50 may be respectively connected to the DCS sub-exhaust line 23 and the $NH_3$ sub-exhaust line 24.

The exhaust apparatus may further include a DCS gas supply ring 31 and an $NH_3$ gas supply ring 32. The DCS gas supply ring 31 may be located between the DCS exhaust path 49 and the DCS sub-exhaust line 23, and the $NH_3$ gas supply ring 32 may be located between the $NH_3$ exhaust path 50 and the $NH_3$ sub-exhaust line 24.

The DCS gas supply ring 31 and the $NH_3$ gas supply ring 32 may be connected to the DCS bypass line 27, the $NH_3$ bypass line 28, the DCS purge argon line 25, and the $NH_3$ purge argon line 26. Therefore, Bypassed DCS and DCS purge argon may be discharged through the DCS gas supply ring 31, the DCS sub-exhaust line 23, the DCS exhaust pump 3, and the DCS scrubber 11, and bypassed $NH_3$ and $NH_3$ purge argon may be discharged through the $NH_3$ gas supply ring 32, the $NH_3$ sub-exhaust line 24, the $NH_3$ exhaust pump 4, and the $NH_3$ scrubber 12.

As illustrated in FIG. 10, the DCS bypass line 27 may be connected to the DCS gas supply ring 31 through a DCS bypass gas supply path 48 formed in a lateral side of the exhaust unit body 21. Similarly, the $NH_3$ bypass line 28 may be connected to the $NH_3$ gas supply ring 32 through an $NH_3$ bypass gas supply path (not shown) formed in a rear side of the exhaust unit body 21.

As illustrated in FIG. 11, the DCS purge argon line 25 and the $NH_3$ purge argon line 26 may respectively be connected to the DCS gas supply ring 31 and the $NH_3$ gas supply ring 32 through pipes penetrating an upper portion of the exhaust unit body 21.

Purge gas (argon) may be discharged to the DCS exhaust pump 3 and the $NH_3$ exhaust pump 4 through the DCS purge argon line 25, the $NH_3$ purge argon line 26, purge gas supply paths formed in the exhaust unit body 21, the DCS gas supply ring 31, the $NH_3$ gas supply ring 32, the DCS sub-exhaust line 23, and the $NH_3$ sub-exhaust line 24.

Similarly, bypassed DCS may be discharged to the DCS exhaust pump 3 through the DCS bypass line 27, the DCS bypass gas supply path 48, the DCS gas supply ring 31, and the DCS sub-exhaust line 23. In addition, bypassed $NH_3$ may be discharged to the $NH_3$ exhaust pump 4 through the $NH_3$ bypass line 28, the $NH_3$ bypass gas supply path (not shown), the $NH_3$ gas supply ring 32, and the $NH_3$ sub-exhaust line 24.

Figure 12:
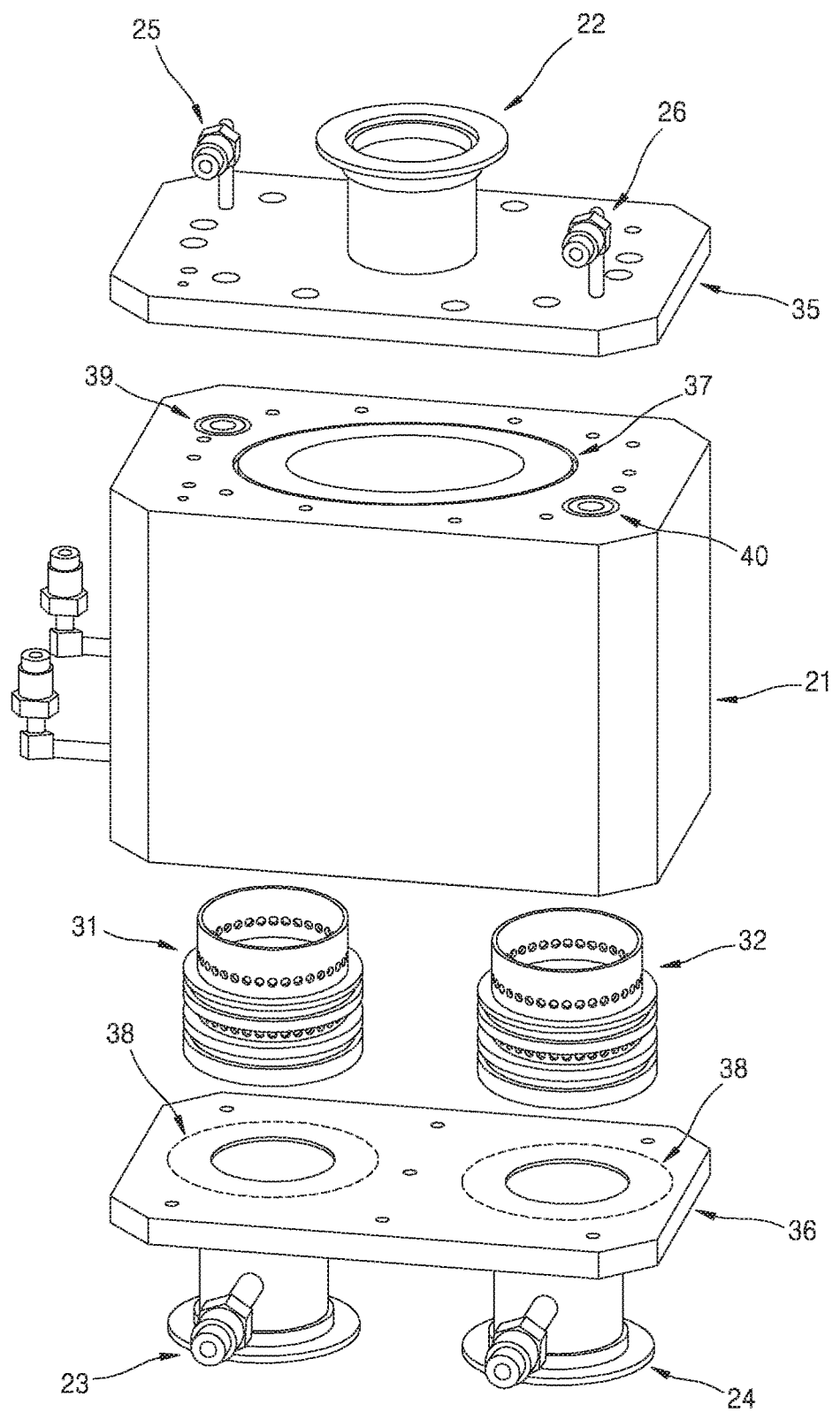
Figure 13:
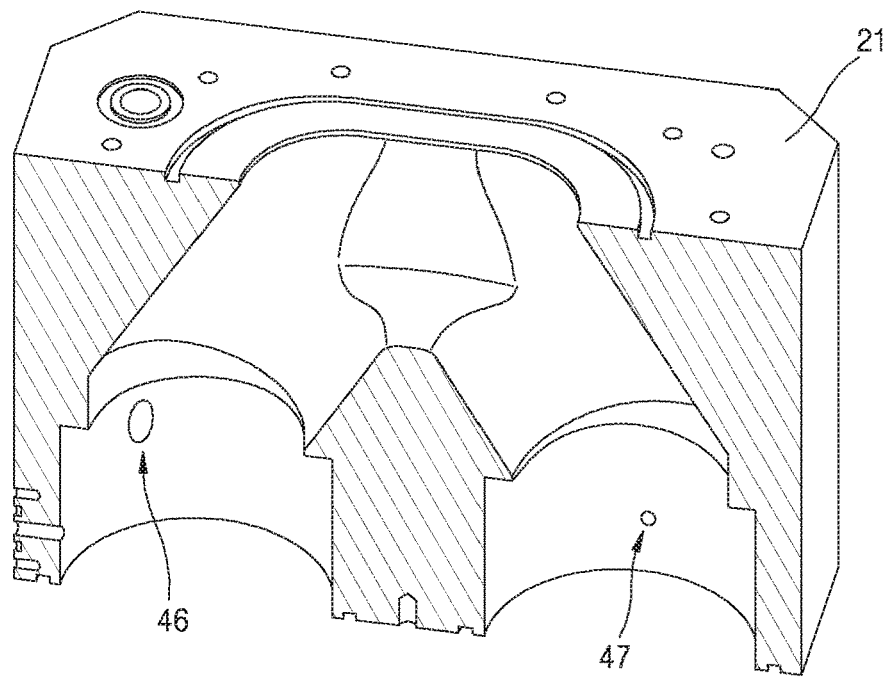

FIG. 12 is an exploded perspective view illustrating the exhaust apparatus depicted in FIG. 8, and FIG. 13 is a cross-sectional view illustrating the exhaust unit body 21. Referring to FIG. 12, the exhaust unit may include an upper plate 35, the exhaust unit body 21, the DCS gas supply ring 31, and the $NH_3$ gas supply ring 32, and a lower plate 36.

The upper plate 35 is connected to the main exhaust line 22, and as described above, the exhaust unit body 21 may include the DCS exhaust path 49 and the $NH_3$ exhaust path 50 that branch off from the main exhaust line 22 in the exhaust unit body 21. A sealing measure 37 may be inserted between the exhaust unit body 21 and the upper plate 35, and thus when the exhaust unit body 21 and the upper plate 35 are coupled to each other, sealing (isolation) may be provided. In the embodiment, the sealing measure may be an O-ring.

In addition, the purge gas supply paths may be formed in the exhaust unit body 21. For example, a DCS purge argon supply path 39 and an $NH_3$ purge argon supply path 40 may be formed in the exhaust unit body 21 as the purge gas supply paths. The DCS purge argon supply path 39 may be connected between the DCS purge argon line 25 and the DCS gas supply ring 31. The $NH_3$ purge argon supply path 40 may be connected between the $NH_3$ purge argon line 26 and the $NH_3$ gas supply ring 32.

As illustrated in FIGS. 12 and 13, the DCS gas supply ring 31 and the $NH_3$ gas supply ring 32 are inserted into the exhaust unit body 21. Each of the DCS gas supply ring 31 and the $NH_3$ gas supply ring 32 may include gas supply holes. Bypassed DCS gas and $NH_3$ gas, DCS purge argon, and $NH_3$ purge argon may be discharged through the gas supply holes. The DCS gas supply ring 31 and the $NH_3$ gas supply ring 32 will be further described hereinafter.

Referring to FIG. 13, exhaust paths may be continuously formed in the exhaust unit body 21. In other words, paths may be bored through upper and lower portions of the exhaust unit body 21 so that exhaust paths connected to each other may be formed. Purge argon supplied to the exhaust unit body 21 through the DCS purge argon supply path 39 may be supplied to the DCS gas supply ring 31 through a gas supply hole 46. In addition, bypassed $NH_3$ gas supplied to the exhaust unit body 21 through the $NH_3$ bypass line 28 and the $NH_3$ bypass gas supply path (not shown) may be supplied to the $NH_3$ gas supply ring 32 through a gas supply hole 47. The positions, sizes, and shapes of holes illustrated in the drawings are examples.

An upper portion of the lower plate 36 may be connected to the DCS gas supply ring 31 and the $NH_3$ gas supply ring 32, and a lower portion of the lower plate 36 may be connected to the DCS sub-exhaust line 23 and the $NH_3$ sub-exhaust line 24. A sealing measure 38 may be inserted between the lower plate 36 and the gas supply rings 31 and 32. Thus, when the lower plate 36 is coupled to the gas supply rings 31 and 32, outside air may not permeate. In the embodiment, the sealing measure may be an O-ring.

Figure 14:
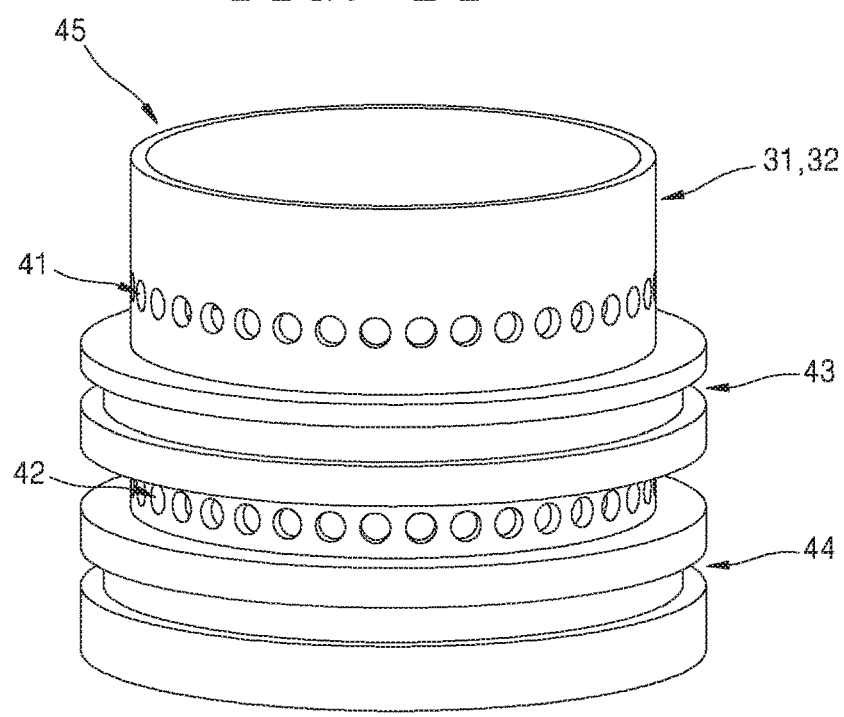
FIG. 14 is a schematic view illustrating a gas supply ring according to an embodiment.
Figure 15:
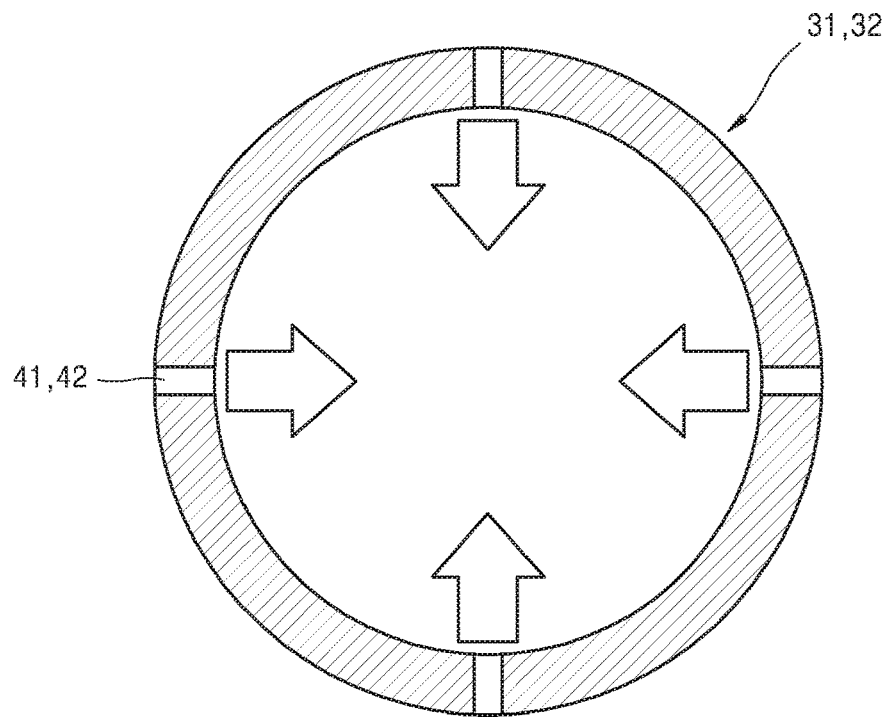
FIGS. 15 to 17 are cross-sectional views illustrating modifications of the gas supply ring illustrated in FIG. 14.
Figure 16:
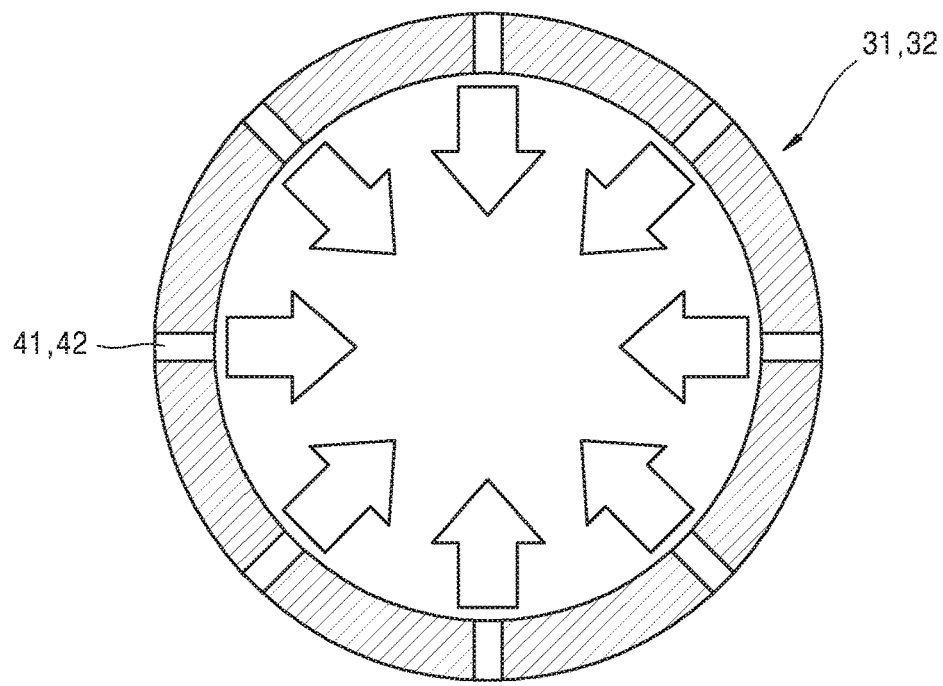
Figure 17:
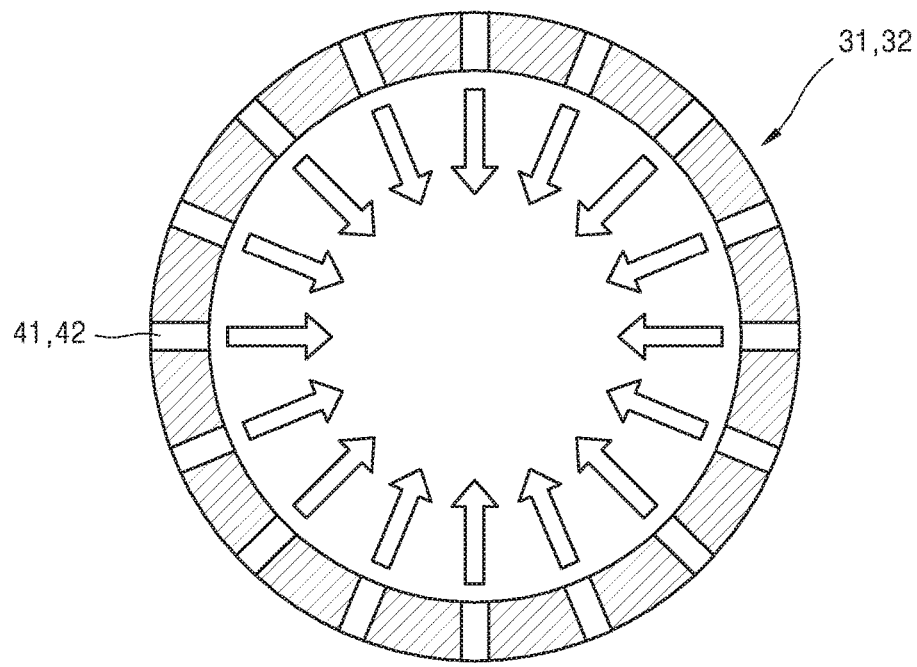

FIG. 14 is a schematic view illustrating a gas supply ring 31 or 32 according to an embodiment. FIGS. 15 to 17 are cross-sectional views illustrating modifications of the gas supply ring illustrated in FIG. 14. The gas supply ring of the current embodiment may be applied to the exhaust apparatuses of the previous embodiments.

Referring to FIG. 14, the gas supply ring 31 or 32 may be inserted into the exhaust unit body 21 and may be connected to the DCS sub-exhaust line 23 or the $NH_3$ sub-exhaust line 24. The gas supply ring 31 or 32 may include upper holes 41, lower holes 42, and sealing measure insertion portions 43 and 44.

The upper holes 41 provide paths through which DCS and $NH_3$ purge argon are discharged, and the lower holes 42 provide paths through which bypassed DCS and $NH_3$ are discharged. That is, the upper holes 41 may be arranged between the lower holes 42 and the main exhaust line 22 including a first region. A gas curtain may be formed in an exhaust path by supplying purge argon to the upper holes 41 arranged as described above. In addition, the upper holes 41 through which purge argon is discharged are located between the lower holes 42 of the gas supply ring 31 or 32 and the first region through which DCS and $NH_3$ are respectively discharged (or $NH_3$ and DCS are respectively discharged), thereby preventing DCS and $NH_3$ from meeting each other and the formation of reaction byproducts in an exhaust unit.

O-rings may be inserted in the sealing measure insertion portions 43 and 44. Thus, gas discharged through the upper holes 41 (or the lower holes 42) may not leak to the lower holes 42 (or the upper holes 41). In addition, gas leakage between the gas supply ring 31 or 32 and the exhaust unit body 21 may be prevented. That is, owing to the sealing measures (the O-rings), gases passing through the upper holes 41 and the lower holes 42 may be not mixed with each other and isolated from the outside.

Referring to FIG. 14, an upper portion 45 of the gas supply ring 31 or 32 and an exhaust path formed inside the exhaust unit body 21 may be brought into tight contact with each other and thus be sealed via face sealing. In other embodiments, however, a sealing measure such as an O-ring may be provided on the upper portion 45 of the gas supply ring 31 or 32.

As described above, a purge argon gas curtain may be uniformly formed in an exhaust line owing to the upper holes 41 and the lower holes 42, and thus bypassed DCS gas or $NH_3$ gas may be uniformly discharged.

In addition, as illustrated in FIGS. 15 to 17, a plurality of holes may be symmetrically arranged along a lateral side of the gas supply ring 31 or 32. For example, four holes may be symmetrically arranged as illustrated in FIG. 15, eight holes may be symmetrically arranged as illustrated in FIG. 16, or sixteen holes may be symmetrically arranged as illustrated in FIG. 17.

The diameter and number of such symmetric holes may be determined to minimize adiabatic expansion of DCS gas and $NH_3$ gas (and a resulting increase in gas flow velocity and a temperature decrease) during a bypass process. Both DCS and $NH_3$ are gases that may be liquefied, and thus if the temperature of DCS or $NH_3$ is rapidly decreased, solid byproducts may be formed on the exhaust apparatus (for example, on an exhaust line, a pump, or a scrubber). Therefore, the diameter and number of such symmetric holes may be adjusted to previously prevent clogging of the exhaust apparatus.

In other words, according to the embodiment, as illustrated in FIGS. 15 to 17, the amount of source gas or reaction gas passing through a unit hole (a single hole) per unit time may be reduced by forming a plurality of holes. Therefore, the temperature of bypassed source gas (DCS) or reaction gas ($NH_3$) passing through the lower holes 42 may not be decreased by adiabatic expansion.

Alternatively, the amount of source gas or reaction gas passing through a unit hole (a single hole) per unit time may be reduced by forming small holes, so as to prevent a decrease in the temperature of the source gas or reaction gas ($NH_3$) caused by adiabatic expansion. The diameter of the lower holes 42 may be within the range of about 2 mm to about 3 mm. For example, the diameter of the lower holes 42 may be 2 mm.

Figure 18:
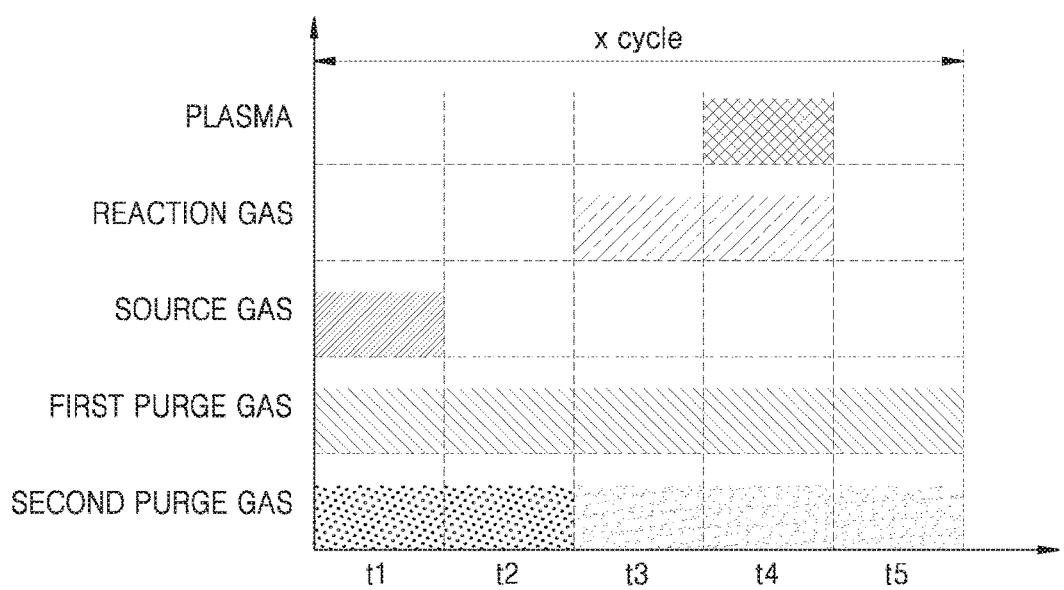
FIG. 18 is a schematic view illustrating a thin film fabricating method according to an embodiment.

FIG. 18 is a schematic view illustrating a thin film fabricating method according to an embodiment. The thin film fabricating method of the current embodiment may be performed using the exhaust apparatuses or the substrate processing apparatuses of the previous embodiments. Thus, the same description as that presented in the previous embodiments will not be presented here.

Referring to FIG. 18, the thin film forming method may include a first step t1 in which a source gas is supplied, a second step t2 in which the source gas is purged, a third step t3 in which a reaction gas is supplied, and a fourth step t4 in which plasma is supplied. The source gas, the reaction gas, and the plasma may be sequentially supplied, and while the source gas, the reaction gas, and the plasma are supplied, a first purge gas and a second purge gas may be continuously supplied to a reaction space.

In addition, a fifth step t5 may be performed to purge remaining gases after the first to fourth steps t1 to t4. In addition, a cycle of the first to fourth steps t1 to t4 (or the first to fifth steps t1 to t5) may be repeated several times.

During the second step t2, the source gas and the first purge gas from a reactor may be discharged through a first path (for example, a first sub-exhaust line) of an exhaust unit. At the same time, the second purge gas may be supplied to a second path (for example, a second sub-exhaust line) of the exhaust unit. The second purge gas may form a gas curtain in the second path of the exhaust unit.

Meanwhile, when one of the source gas and the reaction gas is supplied to the reactor, the other gas may be bypassed to the exhaust unit. While the source gas is supplied in the first step t1, the reaction gas may flow to the exhaust unit through a bypass line. This exhaust flow through the bypass line may maintain continuous flows of gases, and thus the inside pressures of gas lines and the reactor may be constantly maintained.

A path through which bypassed gas is discharged is different from a path through which gas discharged from the reactor is discharged. For example, during the third step t3, the reaction gas and the first purge gas may be supplied to the reactor, and during the fourth step t4, the reaction gas and the first purge gas may be discharged from the reactor. In this case, the reaction gas and the first purge gas may be discharged through the second path (for example, the second sub-exhaust line), and bypassed gas (the source gas) may be discharged through the first path (for example, the first sub-exhaust line).

Figure 19:
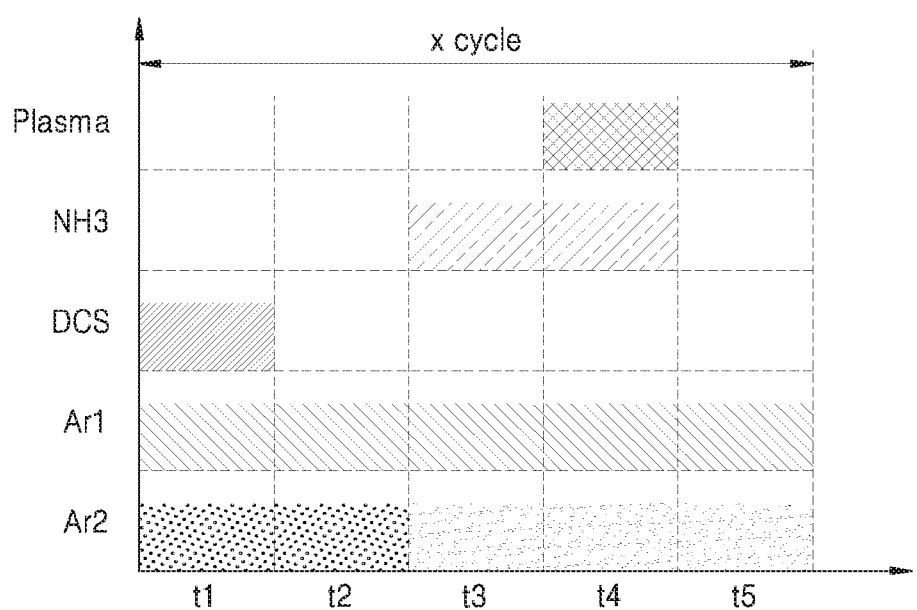
FIG. 19 is a schematic view illustrating a thin film fabricating method according to another embodiment.

FIG. 19 is a schematic view illustrating a thin film forming method according to another embodiment. The thin film forming method of the current embodiment may be a modification of the thin film forming method of the previous embodiment. Thus, the same description as that presented in the previous embodiment will not be presented here.

The thin film forming method may be a method of depositing silicon nitride through an atomic layer deposition process. That is, DCS gas and $NH_3$ gas may be sequentially supplied as a source gas and a reaction gas, and plasma may be supplied in synchronization with the supply of $NH_3$ gas. $NH_3$ gas may be activated by the plasma and react with DCS molecules adsorbed on a substrate, and thus a $Si_xN_y$ layer may be formed on the substrate. These steps may be repeated to increase the thickness of the $Si_xN_y$ layer to a target thickness.

Referring to FIG. 19, a basic cycle including DCS supply (first step step t1), purge (second step t2), $NH_3$ pre-flow (third step t3), $NH_3$ plasma (fourth step t4), and purge (fifth step t5) may be repeated several times until a thin film having a desired thickness is deposited. In third step t3, $NH_3$ may be supplied before plasma is applied. Owing to this $NH_3$ pre-flow, $NH_3$ may be uniformly distributed in a reaction space, and in the next $NH_3$ excitation operation (fourth step t4), $NH_3$ plasma may be uniformly distributed in the reaction space.

During steps t1 to t5, process argon Ar1 may be continuously supplied to the reaction space. The process argon Ar1 may uniformize the inside pressure of the reaction space and may have a function of purging DCS or $NH_3$ gas from the reaction space during steps t2 or t5.

In addition, the flow rate of process argon Ar1 may be adjusted in each step by taking into consideration a total gas flow rate including the flow rate of DCS and the flow rate of $NH_3$. That is, the sum of the flow rate of process argon Ar1 and the flow rate of DCS supplied to the reaction space in step t1 may be set to be equal to the flow rate of process argon Ar1 supplied to the reaction space in step t2. In other words, the flow rate of process argon Ar1 in step t1 may be lower than the flow rate of process argon Ar1 in step t2.

Similarly, since $NH_3$ and process argon Ar1 are supplied to the reaction space in steps t3 and t4, the flow rate of process argon Ar1 supplied to the reaction space during steps t3 and t4 may be lower than the flow rate of process argon Ar1 supplied to the reaction space in step t2 or t5. In this manner, the total flow rate of gases supplied to the reaction space may be constantly maintained throughout steps t1 to t5. Thus, the inside pressure of the reaction space may be constantly maintained during steps t1 to t5, and process stability may be improved.

Referring to FIG. 19, purge argon Ar2 may be continuously supplied during steps t1 to t5. However, unlike the process argon Ar1, the purge argon Ar2 may not be supplied to the reaction space but may be supplied to the DCS sub-exhaust line 6 or the $NH_3$ sub-exhaust line 7 through the purge argon line 10. In the current embodiment, the purge argon Ar2 may flow to the $NH_3$ sub-exhaust line 7 during steps t1 to t2 and to the DCS sub-exhaust line 6 during steps t3 to t5.

Gas flows during steps t1 to t5 will now be specifically described with reference to FIG. 19.

1) Step 1 (t1): DCS is supplied (DCS feeding step). In step 1 (t1), DCS source gas is supplied to a reactor and adsorbed in a substrate loaded in the reactor.

Referring to FIG. 6, a DCS supply valve V1 of the DCS line 19 is opened to supply DCS to the reactor 1. At the same time, process argon Ar1 is supplied to the reactor 1 through the process argon line 18, a second process argon supply valve v6, and the $NH_3$ line 20. At this time, an exhaust valve v7 of the main exhaust line 5 is in an opened state, and DCS and process argon Ar1 remaining in the reactor 1 is directed to the DCS sub-exhaust line 6 and the DCS exhaust pump 3 and is discharged to the outside after being purified by the DCS scrubber 11. At this time, an $NH_3$ supply valve v4 is in a closed state, and thus $NH_3$ is discharged to the outside through a first $NH_3$ bypass valve v5, the $NH_3$ bypass line 9, a second $NH_3$ bypass valve v10, the $NH_3$ exhaust pump 4, and the $NH_3$ scrubber 12.

Meanwhile, purge argon Ar2 may be supplied to the $NH_3$ sub-exhaust line 7 through the purge argon line 10 and an $NH_3$ purge argon valve v11 and may then be discharged to the outside through the $NH_3$ exhaust pump 4 and the $NH_3$ scrubber 12. The purge argon Ar2 supplied to the $NH_3$ sub-exhaust line 7 may form a gas curtain between the $NH_3$ sub-exhaust line 7 and the DCS sub-exhaust line 6. Therefore, DCS source gas discharged to the DCS sub-exhaust line 6 may not flow back to the $NH_3$ sub-exhaust line 7, and thus solid byproducts may not be formed on the $NH_3$ sub-exhaust line 7 by preventing a reaction between the DCS source gas and $NH_3$.

In this step, a first DCS bypass valve v2, a second DCS bypass valve v8, and a DCS purge argon valve v9 are in a closed state. In this case, an anti-backflow device such as a check valve (not shown) may be placed in the connection part 16 between the $NH_3$ bypass line 9 and the $NH_3$ sub-exhaust line 7. Therefore, purge argon Ar2 and NH$_3$ discharged to the NH$_3$ sub-exhaust line 7 may not flow back to the NH$_3$ bypass line 9. In some embodiments, during step 1, the first NH$_3$ bypass valve v5 may be closed to prevent NH$_3$ from flowing to the NH$_3$ bypass line 9. In this case, the consumption of NH$_3$ may be reduced.

2) Step 2 (t2): DCS is purged (DCS purge step). In step 2, the supply of DCS is stopped, and DCS source gas having not undergone a reaction and remaining in the reactor 1 and on a substrate is purged from the reactor 1. In this step, the DCS supply valve v1 and the second process argon supply valve v6 are closed, and a first process argon supply valve v3 is opened, so as to supply process argon Ar1 to the reactor 1 through the DCS line 19. Therefore, DCS gas remaining in the DCS line 19, the gas injection unit 2, and the reactor 1 may be purged to the main exhaust line 5.

During step 2, DCS may be discharged to the outside through the first DCS bypass valve v2, the DCS bypass line 8, the second DCS bypass valve v8, the DCS exhaust pump 3, and the DCS scrubber 11.

An anti-backflow device such as a check valve (not shown) may be placed in the connection part 14 between the DCS bypass line 8 and the DCS sub-exhaust line 6 so as to prevent gas flowing from the reactor 1 to the DCS sub-exhaust line 6 and DCS source gas discharged from the DCS bypass line 8 from flowing back along the DCS bypass line 8. In some embodiments, during step 2, however, the first DCS bypass valve v2 may be closed to prevent DCS gas from flowing to the DCS bypass line 8. In this case, the consumption of DCS source gas may be reduced.

During step 2, like in step 1, NH$_3$ may be discharged to the outside through the NH$_3$ bypass line 9, the NH$_3$ sub-exhaust line 7, the NH$_3$ exhaust pump 4, and the NH$_3$ scrubber 12. In addition, purge argon Ar2 may flow to the NH$_3$ sub-exhaust line 7 through the purge argon line 10 and the NH$_3$ purge argon valve v11, and thus a gas curtain may be formed between the DCS sub-exhaust line 6 and the NH$_3$ sub-exhaust line 7.

3) Step 3 (t3): NH$_3$ previously flows (NH$_3$ pre-flow operation). In this step, NH$_3$ is supplied to the reactor 1 as a reaction gas. As NH$_3$ is supplied to the reactor 1, the distribution of NH$_3$ in the reactor 1 becomes uniform, and when the NH$_3$ is activated by plasma in the next step 4, the concentration of NH$_3$ radicals in a reactor 1 may become uniform.

Referring to FIG. 6, the NH$_3$ supply valve v4 of the NH$_3$ line 20 is opened to supply NH$_3$ to the reactor 1. At the same time, process argon Ar1 is supplied to the reactor 1 through the process argon line 18, the first process argon supply valve v3, and the DCS line 19. At this time, the exhaust valve v7 of the main exhaust line 5 may be in an opened state, and NH$_3$ and process argon Ar1 remaining in the reactor 1 may be discharged to the outside through the NH$_3$ sub-exhaust line 7, the NH$_3$ exhaust pump 4, and the NH$_3$ scrubber 12 after being purified. During step 3, the first NH$_3$ bypass valve v5, the second NH$_3$ bypass valve v10, and the NH$_3$ purge argon valve v11 are in a closed state.

The DCS supply valve v1 is in a closed state, and thus DCS gas may be discharged to the outside through the first DCS bypass valve v2, the DCS bypass line 8, the second DCS bypass valve v8, the DCS sub-exhaust line 6, the DCS exhaust pump 3, and the DCS scrubber 11.

Meanwhile, purge argon Ar2 may be supplied to the DCS sub-exhaust line 6 through the purge argon line 10 and the DCS purge argon valve v9 and may then be discharged to the outside through the DCS exhaust pump 3 and the DCS scrubber 11. The purge argon Ar2 supplied to the DCS sub-exhaust line 6 may form a gas curtain between the DCS sub-exhaust line 6 and the NH$_3$ sub-exhaust line 7. Therefore, discharged NH$_3$ reaction gas may not flow back to the DCS sub-exhaust line 6, and thus solid byproducts may not be formed on the DCS sub-exhaust line 6 by preventing a reaction between the NH$_3$ reaction gas and DCS gas.

An anti-backflow device such as a check valve (not shown) may be placed in the connection part 14 between the DCS bypass line 10 and the DCS sub-exhaust line 6. Therefore, DCS source gas and purge argon Ar2 flowing in the DCS sub-exhaust line 6 may be prevented from flowing back to the DCS bypass line 8. In step 3, however, the first DCS bypass valve v2 may be closed to prevent DCS gas from flowing to the DCS bypass line 8. In this case, the consumption of DCS source gas may be reduced.

4) Step 4 (t4): NH$_3$ is activated by plasma (plasma excitation step). In this step, NH$_3$ supplied to the reactor 1 in step 3 is activated by plasma. In this step, NH$_3$ is continuously supplied, and each valve and each gas are operated and directed in the same manner as in step 3. As illustrated in FIG. 6, plasma may be generated above a substrate placed inside the reactor 1 by an in-situ plasma method. Alternatively, plasma may be generated outside the reactor 1 and may be supplied to a reaction space of the reactor 1 by a remote plasma method. NH$_3$ may be activated using an ultraviolet (UV) generator instead of using an RF generator.

5) Step5 5 (t5): NH$_3$ is purged (NH$_3$ purge operation). In step 5 (t5), the supply of NH$_3$ is stopped, and NH$_3$ reaction gas having not undergone a reaction and remaining in the reactor 1 and on a substrate is discharged from the reactor 1. In step 5, the NH$_3$ supply valve v4 and the first process argon supply valve v3 are closed, and the second process argon supply valve v6 is opened, so as to supply process argon Ar1 to the reactor 1 through the NH$_3$ line 20. Therefore, NH$_3$ gas remaining in the NH$_3$ line 20, the gas injection unit 2, and the reactor 1 is purged to the main exhaust line 5. At this time, NH$_3$ is discharged to the outside through the first NH$_3$ bypass valve v5, the NH$_3$ bypass line 9, the second NH$_3$ bypass valve v10, the NH$_3$ sub-exhaust line 7, the NH$_3$ exhaust pump 4, and the NH$_3$ scrubber 12.

An anti-backflow device such as a check valve (not shown) may be placed in the connection part 16 between the NH$_3$ bypass line 9 and the NH$_3$ sub-exhaust line 7 so as to prevent purge argon Ar2 and NH$_3$ discharged to the NH$_3$ sub-exhaust line 7 from flowing back to the NH$_3$ bypass line 9. However, the first NH$_3$ bypass valve v5 may be closed to prevent NH$_3$ from flowing to the NH$_3$ bypass line 9. In this case, the consumption of NH$_3$ may be reduced.

During step 5, like in steps 3 and 4, DCS gas may be discharged to the outside through the DCS bypass line 8, the DCS sub-exhaust line 6, the DCS exhaust pump 3, and the DCS scrubber 11. Purge argon Ar2 may flow to the DCS sub-exhaust line 6 through the purge argon line 10 and the DCS purge argon valve v9, and thus a gas curtain may be formed between the DCS sub-exhaust line 6 and the NH$_3$ sub-exhaust line 7. In this step, however, the first DCS bypass valve v2 may be closed to prevent DCS gas from flowing to the DCS bypass line 8. In this case, the consumption of DCS source gas may be reduced.

The descriptions of the previous embodiments have been presented based on an atomic layer deposition process or a plasma atomic layer deposition process. However, the embodiments are for illustrative purposes only. The inventive concept is to form a gas curtain in a second region to prevent a first gas from being discharged through the second region when the first gas is supplied and discharged through a first region and a gas curtain in the first region to prevent a second gas from being discharged through the first region when the second gas is supplied and discharged through the second region, and the inventive concept may be applied to not only deposition processes but also chemical vapor deposition (CVD) processes, cleaning processes, and other processes in which fluids are required to be separately discharged.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. An exhaust apparatus comprising:
   a first exhaust line;
   a second exhaust line connected to the first exhaust line;
   a third exhaust line connected to the first exhaust line;
   a first ring placed in the second exhaust line, the first ring having at least one hole on a lateral side thereof; and
   a first gas line connected to the second exhaust line through the first ring,
   wherein when gas is supplied to the first gas line, the first exhaust line does not communicate with the second exhaust line but communicates with the third exhaust line.

2. The exhaust apparatus of claim 1, further comprising a second gas line connected to the third exhaust line,
   wherein when gas is supplied to the second gas line, the first exhaust line does not communicate with the third exhaust line but communicates with the second exhaust line.

3. The exhaust apparatus of claim 2, wherein the first gas line and the second gas line are connected to each other.

4. The exhaust apparatus of claim 1,
   wherein the at least one hole of the first gas supply ring is connected to the first gas line.

5. The exhaust apparatus of claim 1, further comprising a bypass line connected to the second exhaust line.

6. The exhaust apparatus of claim 5,
   wherein the first ring comprises:
      a first hole connected to the first gas line; and
      a second hole connected to the bypass line.

7. The exhaust apparatus of claim 6, wherein the first hole is located between the second hole and the first exhaust line.

8. The exhaust apparatus of claim 7, wherein when gas is supplied to the first gas line, gas from the first exhaust line is discharged to the third exhaust line, and gas from the bypass line is discharged to the second exhaust line.

9. The exhaust apparatus of claim 8, wherein gas supplied through the first gas line does not react with gas supplied through the bypass line.

10. The exhaust apparatus of claim 2, wherein the first gas line comprises a first opening/closing unit,
    the second gas line comprises a second opening/closing unit, and
    the exhaust apparatus further comprises a controller configured to control the first and second opening/closing units.

11. The exhaust apparatus of claim 10, further comprising a gas analysis unit connected to at least one of the first exhaust line, the second exhaust line, and the third exhaust line,
    wherein the controller communicates with the gas analysis unit and determines operation timing of the first and second opening/closing units.

12. An exhaust apparatus comprising:
    a main exhaust line;
    an upper plate connected to the main exhaust line;
    a body having a first exhaust path and a second exhaust path that branch off from the main exhaust line;
    at least one ring inserted into the body, the ring having at least one hole on a lateral side thereof;
    a lower plate having a portion connected to the ring;
    a first sub-exhaust line connected to the first exhaust path; and
    a second sub-exhaust line.

13. The exhaust apparatus of claim 12, further comprising at least one purge gas supply path penetrating the body and connected to the ring.

14. The exhaust apparatus of claim 13, wherein the gas supply ring is located between the exhaust path and the first sub-exhaust line or between the exhaust path and the second sub-exhaust line.

15. The exhaust apparatus of claim 14, further comprising at least one bypass gas supply path penetrating the body and connected to the gas supply ring.

16. The exhaust apparatus of claim 15,
    wherein the at least one gas hole of the ring comprises:
       an upper hole connected to the purge gas supply path; and
       a lower hole connected to the bypass gas supply path,
    wherein the exhaust apparatus further comprises a sealing measure between the upper hole and the lower hole.

17. The exhaust apparatus of claim 16, wherein purge gas discharged to the exhaust path formed in the body through the purge gas supply path and the upper hole forms a gas curtain in the exhaust path.

18. The exhaust apparatus of claim 16, wherein gas flowing to the exhaust path through the purge gas supply path and the upper hole of the ring is an inert gas, and
    gas flowing to the exhaust path through the bypass gas supply path and the lower hole of the ring is dichlorosilane (DCS, $SiH_2Cl_2$) gas or $NH_3$ gas.

19. The exhaust apparatus of claim 12, further comprising an anti-backflow device connected to the purge gas supply path.

20. A substrate processing apparatus comprising:
    a gas supply unit;
    a reactor;
    an exhaust unit; and
    an exhaust pump unit,
    wherein the gas supply unit comprises:
       at least one gas line through which gas is supplied to the reactor from the gas supply unit;
       a bypass line branching off from the gas line and connected to the exhaust unit; and
       a purge gas line connected from the gas supply unit to the exhaust unit,
    wherein the exhaust unit comprises:
       a main exhaust line;
       an upper plate connected to the main exhaust line;
       a body having a first exhaust path and a second exhaust path that branch off from the main exhaust line;
       at least one ring inserted into the body, the ring having at least one hole on a lateral side thereof;

a lower plate having a portion connected to the ring;

a first sub-exhaust line connected to the first exhaust path;

a second sub-exhaust line connected to the second exhaust path; and at least one purge gas supply path penetrating the body and connected to the ring.

21. The substrate processing apparatus of claim 20, wherein the main exhaust line is connected to the reactor, and the sub-exhaust line is connected to the exhaust pump unit.

22. The substrate processing apparatus of claim 21, wherein the gas supply ring is located between the exhaust path and the sub-exhaust line.

23. The substrate processing apparatus of claim 22, wherein the at least one purge gas supply path penetrates the upper plate and is connected to the exhaust path, and wherein the substrate processing apparatus further comprises at least one bypass supply path penetrating the body and connected to exhaust path and the gas supply ring, wherein the purge gas supply path is connected to the purge gas line, and the bypass gas supply path is connected to the bypass line.

24. The substrate processing apparatus of claim 23, wherein the gas supply ring comprises at least one hole at a lateral side of the body, wherein the at least one hole comprises:

an upper hole through which a purge gas from the purge gas supply path passes; and a lower hole through which a bypass gas from the bypass gas supply path passes.

25. The substrate processing apparatus of claim 24, wherein the lower hole is located between the upper hole and the lower plate.

* * * * *